United States Patent [19]
Shigematsu et al.

[11] Patent Number: 5,473,571
[45] Date of Patent: Dec. 5, 1995

[54] DATA HOLD CIRCUIT

[75] Inventors: Satoshi Shigematsu, Zama; Shin'ichiro Mutoh, Atsugi; Yasuyuki Matsuya, Isehara, all of Japan

[73] Assignee: Nippon Telegraph and Telephone Corporation, Tokyo, Japan

[21] Appl. No.: 315,247

[22] Filed: Sep. 29, 1994

[30] Foreign Application Priority Data

Sep. 30, 1993 [JP] Japan .................................. 5-268245
Nov. 10, 1993 [JP] Japan .................................. 5-304865

[51] Int. Cl.$^6$ .................................................. G11C 13/00
[52] U.S. Cl. .................................. 365/227; 365/189.01
[58] Field of Search .................................. 365/226, 227, 365/228, 189.01, 203

[56] References Cited

U.S. PATENT DOCUMENTS 5,408,435  4/1995  McClure et al. .................. 365/228

FOREIGN PATENT DOCUMENTS

WO85/02275  5/1985  WIPO .

Primary Examiner—Terrell W. Fears
Attorney, Agent, or Firm—Frishauf, Holtz, Goodman, Langer & Chick

[57] ABSTRACT

A data hold circuit storing a logic state of a predetermined node of a logic circuit immediately before power supply to the logic circuit is interrupted, and restoring the stored logic state to the predetermined node immediately after the power supply is restarted. The data hold circuit includes a memory circuit storing the logic state of the node, a switch circuit connected between the memory circuit and the node, and a control circuit controlling the on/off operation of the switch circuit. The control circuit turns on the switch circuit for a predetermined time period when the power supply is changed from on to off, or from off to on. The memory circuit is continuously supplied with power from a power supply other than that for the logic circuit. While the power supply to the logic circuit is in a steady state either in the power on state or power off state, the switch circuit is kept off, thereby preventing effect of the memory circuit on the logic circuit.

20 Claims, 28 Drawing Sheets

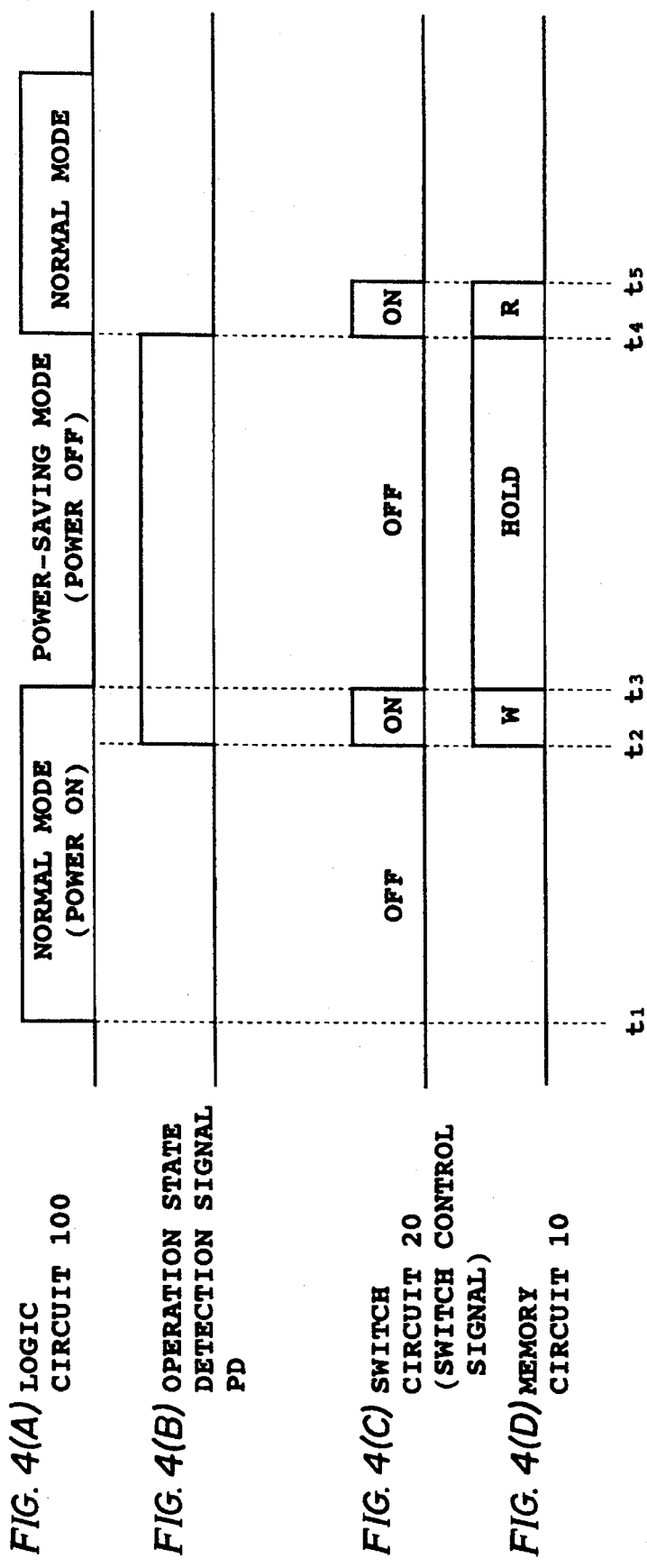

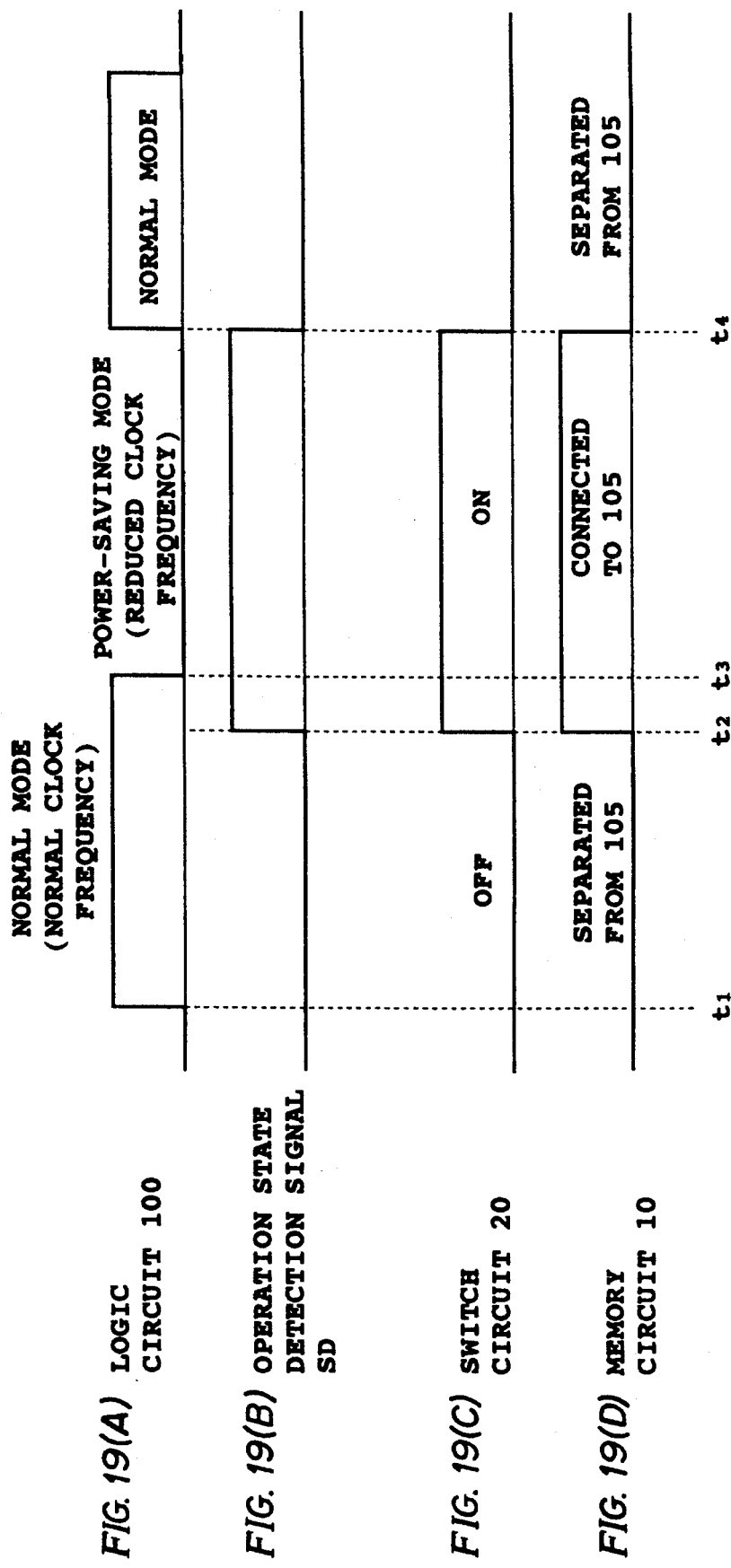

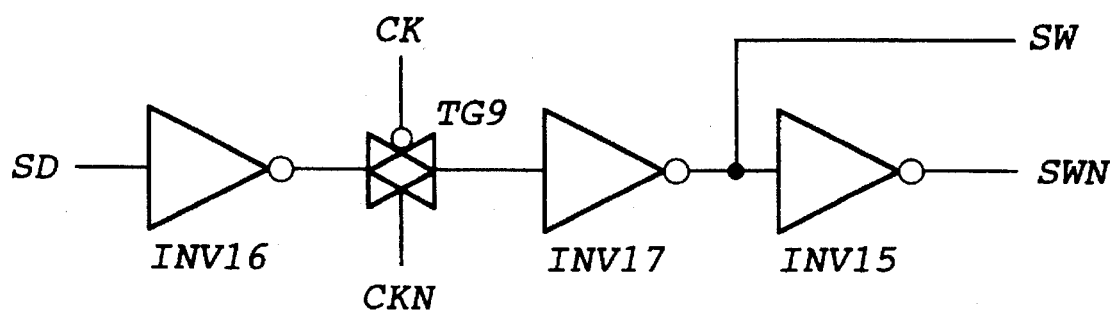
FUG.21

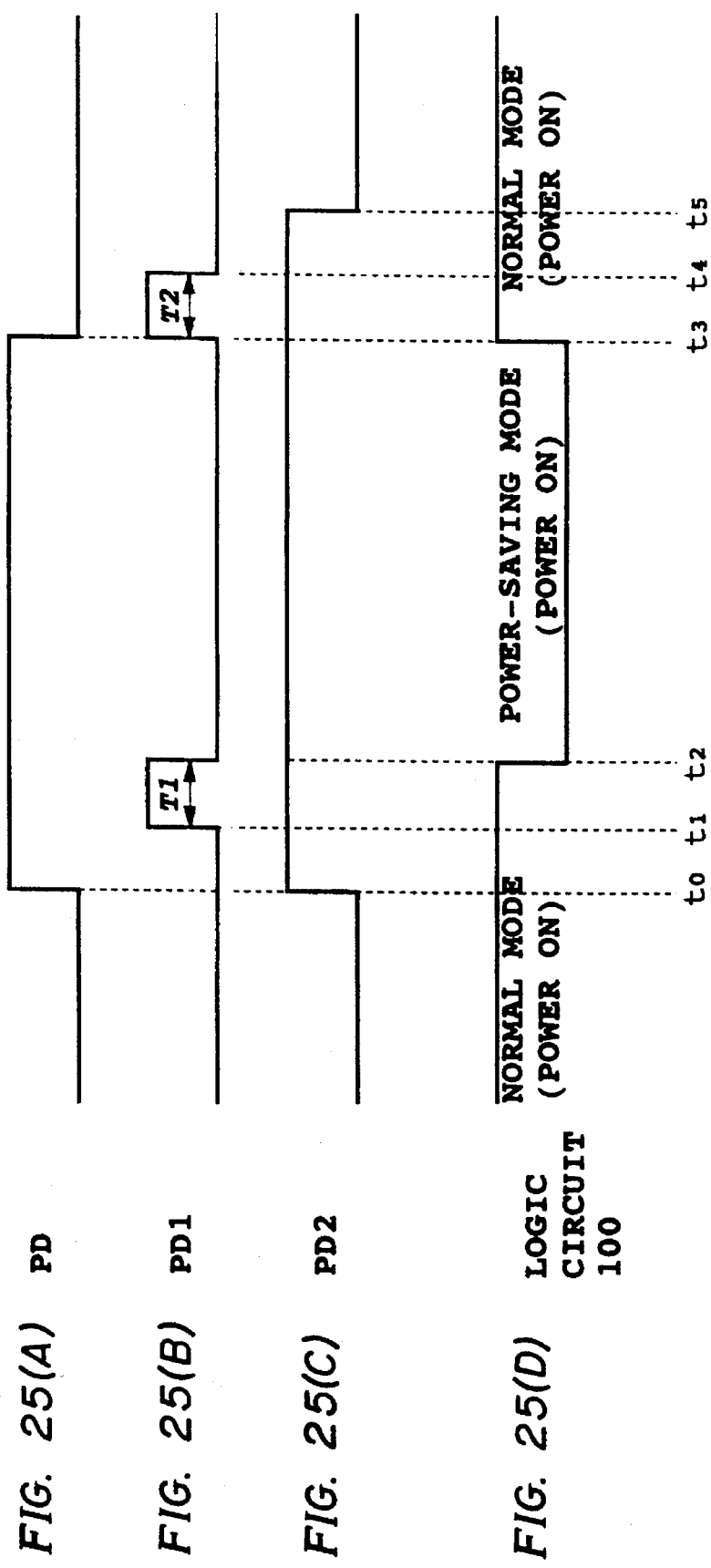

DATA HOLD CIRCUIT

BACKGROUND OF THE INVENTION

1. Field of the Invention

The present invention relates to a data hold circuit capable of achieving power-saving of a logic circuit by holding the state of a node or nodes in the logic circuit.

2. Description of Related Art

Power management technique for saving power of a circuit has been used recently. To save power, a clock frequency of a circuit in an non-operation state is decreased, or the power supply to the circuit is interrupted. Such a circuit is generally arranged using a static circuit. Here, a static circuit is a term representing the opposite of a dynamic circuit, and refers to a circuit which holds a logic state by a constant current or voltage. On the other hand, a dynamic circuit refers to a circuit which utilizes a temporary storing function of the capacitance of a MOS transistor. Although a static circuit employs a power-saving technique which interrupts a clock signal while maintaining the power in the ON state, it is unavoidable for a current to flow to some extent.

Thus, a more promising power management technique is thought, in which the power supply to a non-operating block of a circuit, or to a non-operating circuit in its entirety, is turned off. This technique, however, is seldom used at present. This is because a circuit such as a flip-flop cannot hold its state when the power supply is turned off in spite of its necessity to hold its state during a non-operation state. Accordingly, a high speed circuit is desired which can hold its state even if the power supply is turned off.

SUMMARY OF THE INVENTION

It is therefore an object of the present invention to provide a data hold circuit which can hold the state of a logic circuit during the interruption of the power supply to the logic circuit, and which has little effect on the logic circuit.

Another object of the present invention is to provide a data hold circuit which can simultaneously achieve high speed operation and power saving by operating a logic circuit as a dynamic circuit while the clock frequency of the logic circuit is high, and by operating the logic circuit as a static circuit while the clock frequency is low.

According to one aspect of the present invention, there is provided a data hold circuit connected to a logic circuit which has a normal mode and a power-saving mode as operation modes, the logic circuit operating normally in the normal mode, and performing power saving in the power-saving mode by interrupting power to the logic circuit or by reducing a clock frequency of the logic circuit, the data hold circuit comprising:

a memory circuit which is continuously supplied with power, at least 1-bit data being writable into and readable from the memory circuit;

a switch circuit including at least one switch element connected between a predetermined node in the logic circuit and the memory circuit; and a control circuit controlling the switch circuit, the control circuit holding the switch element in an off state in the normal mode, holding the switch element in an ON state at least for a first predetermined time period at a transition from the normal mode to the power-saving mode, and holding the switch element in an ON state at least for a second predetermined time period at a transition from the power-saving mode to the normal mode.

Here, the control circuit may hold the switch element in an off state in the power-saving mode after the first predetermined time period has elapsed, and the memory circuit may store a logic state of the node in the first predetermined time period, and may supply the node with the content stored in the memory circuit in the second predetermined time period.

The data hold circuit may further comprise an operation state detection circuit which detects an operation state of the logic circuit and produces an operation state detection signal, wherein the control circuit may generate a signal defining the first predetermined time period and the second predetermined time period on the basis of the operation state detection signal.

The memory circuit may comprise a first inverter whose input terminal is connected to the switch element, and a second inverter whose input terminal is connected to an output terminal of the first inverter, and whose output terminal is connected to the input terminal of the first inverter.

Switch circuit may comprise a plurality of switch elements, each of the switch elements being connected between a particular node of the logic circuit and one of the switch elements in the memory circuit, and the control circuit may control all of the switch elements at the same time.

The logic circuit may comprise a shift register including a plurality of D flip-flops, and each bit of the memory circuit may be connected to a node representing the logic state of each one of the D flip-flops via the each one of the switch elements.

The memory circuit and the switch circuit may be formed by arranging a plurality of cells, each of the cells including a memory element storing 1-bit data, and a switch element connected between the memory element and one of the nodes, and wherein a bus line from the control circuit may be passed through each one of the cells.

The memory circuit may comprise a first inverter whose input terminal is connected to the switch element, a second inverter whose input terminal is connected to an output terminal of the first inverter, and a transmission gate whose first terminal is connected to an output terminal of the second inverter and whose second terminal is connected to the switch element, the transmission gate being kept off during the first predetermined time period, and kept on during the second predetermined time period.

The control circuit may comprise a counter counting a clock signal, a plurality of D flip-flops sequentially reading the operation state detection signal in response to count values of the counter, and a gate circuit generating, on the basis of outputs of the D flip-flops, a signal defining the first predetermined time period and the second predetermined time period, and a signal turning the transmission gate on and off.

The operation state detection circuit may produce the operation state detection signal designating the power-saving mode when an idle state, in which the logic circuit does not process data, continues for a predetermined time period.

The operation state detection circuit may produce the operation state detection signal which designates the normal mode when the operation state detection circuit detects, in a time division multiplex signal inputted to the logic circuit, data addressed to the logic circuit, and which designates the power-saving mode in the other conditions.

The logic circuit may include a dynamic latch circuit, the switch element may be connected to a data holding node of the dynamic latch circuit, and the control circuit may keep the switch element ON during the power-saving mode so that the memory circuit is combined with the dynamic latch circuit to constitute a static latch circuit during the power-saving mode.

The control circuit may include an operation speed detection circuit which decides that it is the normal mode when a clock frequency supplied to the dynamic latch circuit is higher than a predetermined value, and that it is the power-saving mode when the clock frequency is lower than the predetermined value.

The dynamic latch circuit may comprise a first inverter, a first transmission gate, and a second inverter connected in cascade, and the switch element may be connected to the connecting point of the first transmission gate and the second inverter.

The memory circuit may comprise a third inverter whose input terminal is connected to the switch element, a fourth inverter whose input terminal is connected to an output terminal of the third inverter, and a second transmission gate connected between an output terminal of the fourth inverter and an input terminal of the third inverter, and wherein the first transmission gate and the second transmission gate may be alternately turned on and off.

The operation speed detection circuit may comprise a delay inverter whose input terminal is supplied with a clock signal, a coincidence circuit whose first input terminal is supplied with the clock signal and whose second input terminal is supplied with the output of the delay inverter, an inverter inverting the output of the coincidence circuit, and a capacitor connected to the output of the inverter.

Input terminals of the logic circuit may be connected to output terminals of another circuit, the control circuit, immediately before supply of power to the logic circuit is interrupted, may lock a state of output data of the output terminals of the another circuit, and subsequently, may turn on the switch circuit for the first predetermined time period, and the control circuit, immediately after the supply of the power to the logic circuit is restarted, may turn the switch circuit on for the second predetermined time period, and subsequently, may release the locked state of the output data of the output terminals of the another circuit.

According to a first aspect of the present invention, the node state can be stored and restored without having effect on the logic circuit including the node. Therefore, a normal operation is maintained even if the power supply to the logic circuit is turned on and off randomly. This makes power-saving of the logic circuit possible.

According to a second aspect of the present invention, the operation of the dynamic circuit (a dynamic latch, for example) can be switched between the dynamic operation mode during a high clock frequency and the static operation mode during a low clock frequency. As a result, a stable operation can be achieved at a high-speed operation and at a low-speed operation. In addition, power-saving can be accomplished during the low-speed operation.

The above and other objects, effects, features and advantages of the present invention will become more apparent from the following description of the embodiments thereof taken in conjunction with the accompanying drawings.

BRIEF DESCRIPTION OF THE DRAWINGS

FIGS. 4(A) to 4(D) are waveform charts illustrating the operation of the data hold circuit of FIG. 3A;

FIGS. 19(A) to 19(D) are waveform charts illustrating the operation of the data hold circuit of FIG. 18A;

FIG. 21 is a circuit diagram showing a variation of the control circuit of FIG. 18A;

FIGS. 25(A) to 25(D) are waveform charts illustrating the operation of the data hold circuit of FIG. 24.

DETAILED DESCRIPTION OF PREFERRED EMBODIMENTS

The invention will now be described with reference to the accompanying drawings. Before that, the principle of the present invention will be described.

Figure 1:
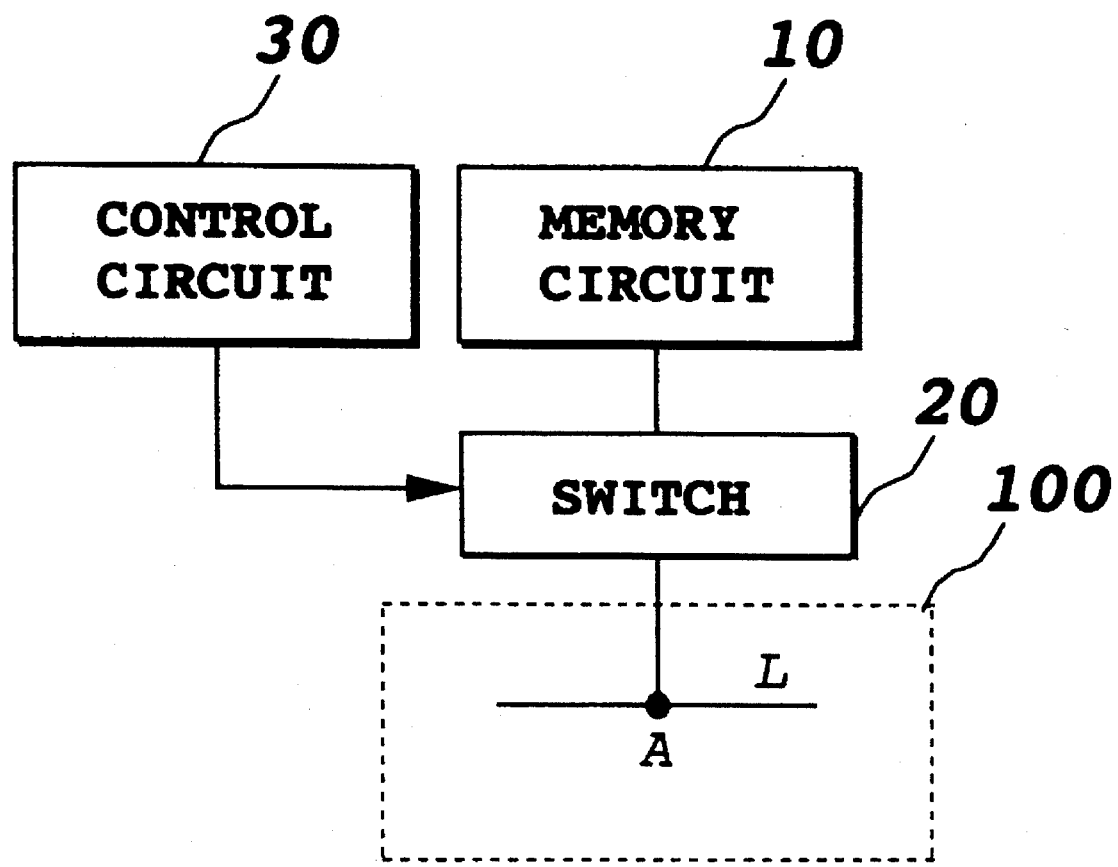
FIG. 1 is a block diagram for explaining the principle of a data hold circuit in accordance with the present invention, which can store and restore the logic state of a node A of a logic circuit.
Figure 2A:
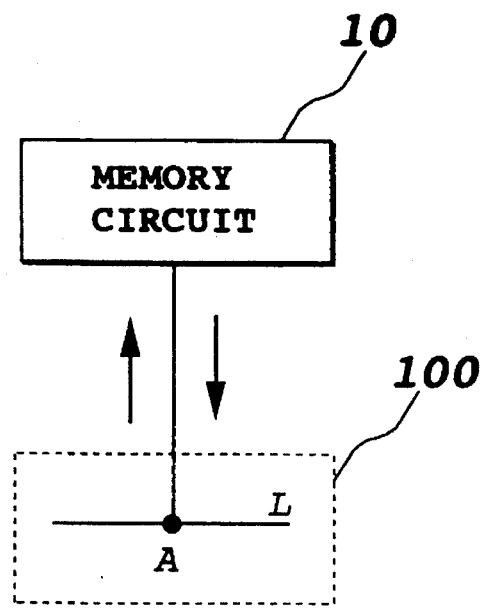
FIG. 2A is a block diagram for explaining the operation of the data hold circuit of FIG. 1 when the switch circuit is in the ON state.
Figure 2B:
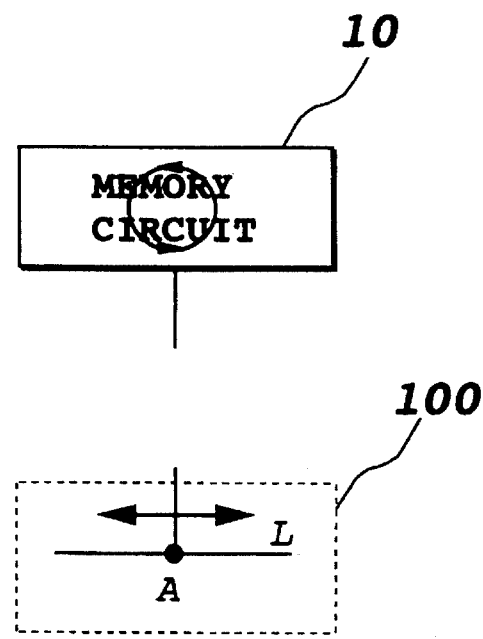
FIG. 2B is a block diagram for explaining the operation of the data hold circuit of FIG. 1 when the switch circuit is in the OFF state.

FIGS. 1, 2A and 2B are block diagrams illustrating the principle of a data hold circuit in accordance with the present invention. A particular node A on a particular wire L in a logic circuit 100 is connected to a memory circuit 10 via a switch circuit 20. The memory circuit, which is continuously supplied with power, stores at least 1-bit data. The switch circuit 20 receives ON/OFF control of the control circuit 30.

When the switch circuit 20 is in the ON state, the memory circuit 10 stores the logic state (high or low) of the node A, or restores the logic state retained in the memory circuit 10 to the node A as shown in FIG. 2A. On the other hand, when the switch circuit 20 is in the OFF state, the memory circuit 20 is separated from the node A as shown in FIG. 2B, thereby retaining the stored content without having effect on the node A.

In a normal mode, in which a normal operation is carried out at a normal clock frequency, the switch 20 is kept open so that the logic circuit 100 can operate without being affected by the memory circuit 10. On the other hand, at the instant when the logic circuit 100 changes its operation mode from the normal mode, in which the power is in the ON state, to a power-saving mode, in which the power is in the OFF state, the logic state of the logic circuit 100 is stored in the memory circuit 10 by closing the switch circuit 20 for a predetermined time period. Reversely, when the logic circuit 100 changes its operation mode from the power-saving mode to the normal mode, the switch circuit 20 is closed for a predetermined time period so that the stored data in the memory circuit 10 is restored to the node to set the logic state of the logic circuit 100 to that immediately before the power is turned off. Thus, the logic circuit 100 can continue the normal operation after the power-saving mode as if nothing had happened.

EMBODIMENT 1

Figure 3A:
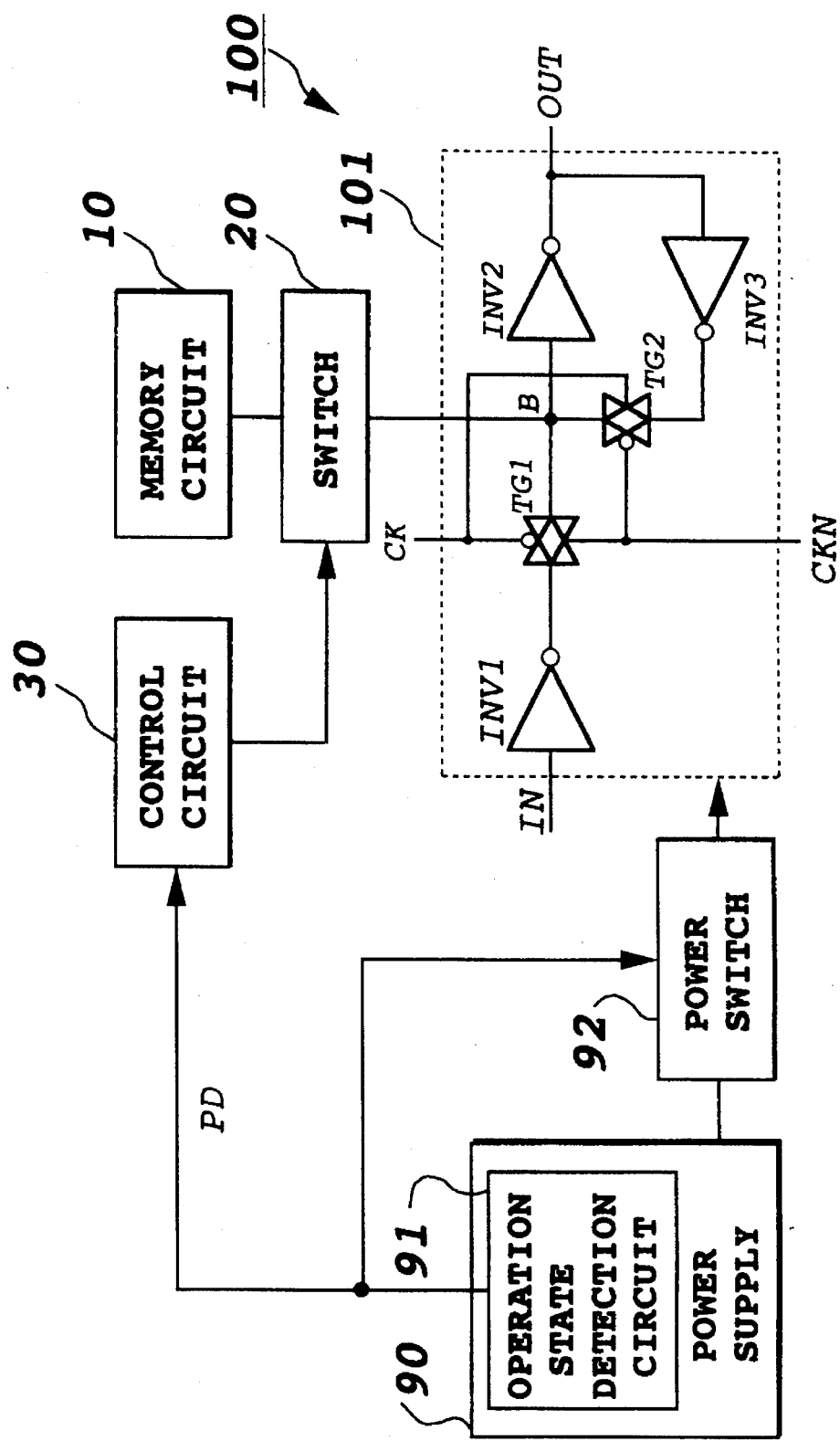
FIG. 3A is a block diagram showing a first embodiment of a data hold circuit in accordance with the present invention, which can store and restore the logic state of a node B of a static latch circuit.

FIG. 3A shows a first embodiment of a data hold circuit in accordance with the present invention. This embodiment employs a static latch circuit 101 as a part of the logic circuit 100. A node B which holds the state of the latch circuit 101 is connected to the memory circuit 10 via the switch circuit 20. The latch circuit 101 is supplied with power from a power supply 90 which can be turned on and off. The power supply 90 includes an operation state detection circuit 91 for detecting the operation state of the logic circuit 100 including the latch circuit 101.

The operation state detection circuit 91 detects the operation state of the logic circuit 100, and produces an operation state detection signal PD as illustrated in FIG. 4 (B). The state of operation of a logic circuit generally includes an operation state, in which data to be processed are present and the data are being processed; an idle state, in which data to be processed are absent, and no substantial processing is carried out; and a power-off state, in which power is in the OFF state. The idle state is further divided into a first idle state, in which the logic circuit operates at a normal clock frequency, and a second idle state, in which the logic circuit operates at a reduced clock frequency. When the first idle state continues for more than a predetermined time period, it would be preferable that power-saving be achieved by changing the state to the second idle state or by turning off the power supply. Conversely, when data to be processed occur, the power supply must be turned on at once. In this specification, the operation state and the first idle state are referred to as a normal mode, and the power-off state and the second idle state are referred to as a power-saving mode.

When the first idle mode, in which the logic circuit operates at the normal clock frequency, continues for more than a predetermined time period, the operation state detection circuit 91 outputs a high-level signal as shown from time t2–t4 of FIG. 4(B). This signal PD commands a switching from the normal mode to the power-saving mode, or vice versa. Thus, the operation state detection signal PD changes to high when the operation is to be switched to the normal mode, or to low at the end of the power-saving mode.

The operation state detection signal PD is supplied to the control circuit 30 and a power switch 92. The control circuit 30 generates on the basis of the signal PD a switch control signal which is kept high for a certain time period at the end and at the start of the normal mode as shown in FIG. 4(C), and controls the switch circuit 20 to be turned on and off. The power switch 92 turns on or off the power from the power supply 90 to the logic circuit 100.

The latch circuit 101 reverses the data supplied to the input terminal IN by the inverter INV1, passes the reversed data through a transmission gate TG1, and reads and holds the reversed data by a circuit including inverters INV2 and INV3, and a transmission gate TG2. More specifically, the reversed data is read in when the transmission gate TG1 is turned on by a low level of the clock signal CK, and is held by the inverters INV2 and INV3 when the transmission gate TG2 is turned on by a high level of the clock signal CK. Accordingly, a node B is a node that holds the latched state.

Figure 3B:
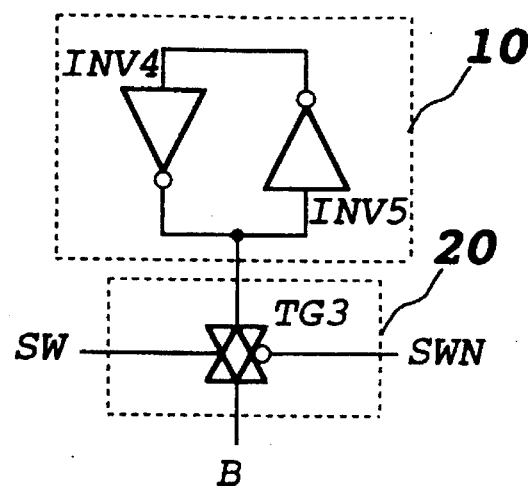
FIG. 3B is a circuit diagram showing a memory circuit and a switch circuit of the data hold circuit of FIG. 3A.

FIG. 3B is a circuit diagram showing the arrangement of the memory circuit 10 and the switch circuit 20. The memory circuit 10 includes two inverters INV4 and INV5 connected in antiparallel. Specifically, the input terminal of the inverter INV4 is connected to the output of the inverter INV5, and the output terminal of the inverter INV4 is connected to the input terminal of the inverter INV5. In addition, the input terminal of the inverter INV5 and the output terminal of the inverter INV4 are connected to the switch circuit 20. The memory circuit 10 is connected to a power supply other than the power supply 90, and the power of the memory circuit 10 is continuously kept on. The switch circuit 20 includes a transmission gate TG3, and is turned on and off by the switch control signal SW and its negation signal SWN from the control circuit 30.

Figure 3C:
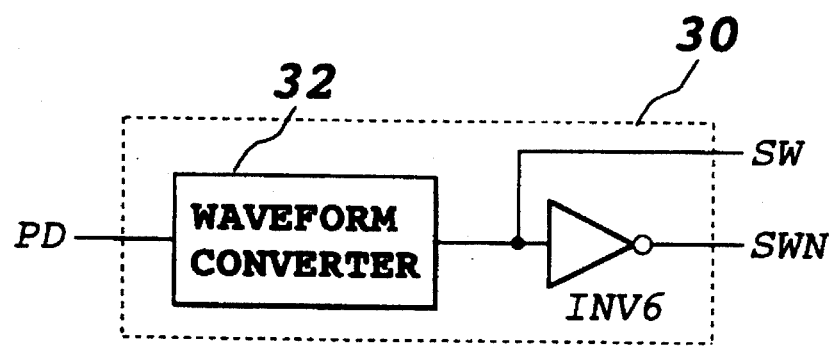
FIG. 3C is a circuit diagram showing a control circuit of the data hold circuit of FIG. 3A.

FIG. 3C is a circuit diagram showing the control circuit 30. The control circuit 30 has a waveform converter 32 for converting the operation state detection signal PD as shown in FIG. 4(B) into the switch control signal as shown in FIG. 4(C), and an inverter INV6 connected to the output terminal of the waveform converter 32. The control circuit 30 inputs the operation state detection signal PD, and outputs the switch control signal SW and its negation signal SWN. The switch control signal SW is kept low while the logic circuit 100 is in a steady state in the normal mode or the power-saving mode.

Next, the operation of the embodiment will be described referring to FIGS. 4 and 5A–5C.

(1) When the logic circuit 100 including the latch circuit 101 is in the normal mode, the switch control signal SW is generally low as shown in FIG. 4(C). Therefore, the switch circuit 20 is kept OFF, and the memory circuit 10 is separated from the node B. As a result, the load of the node B due to the latch 101 is small, and hence, the memory circuit 10 little reduces the operation speed of the latch 101.

Figure 5C:
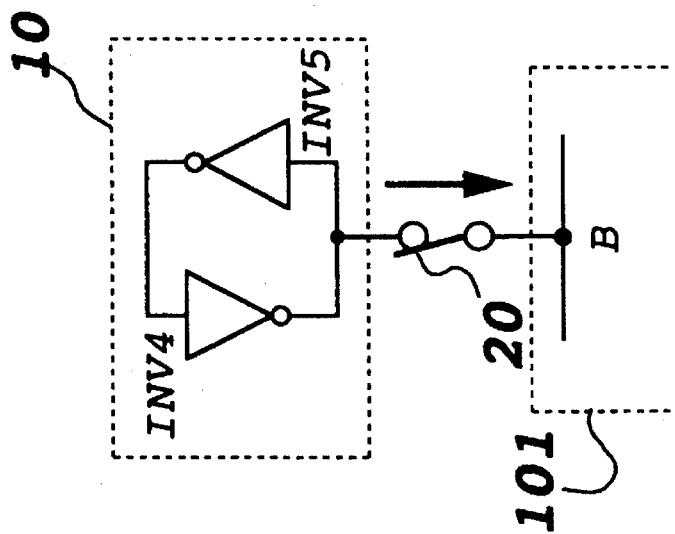
FIGS. 5A–5C are circuit diagrams illustrating the operation of the memory circuit and the switch circuit of the data hold circuit of FIG. 3A.

(2) When the logic circuit 100 including the latch circuit 101 changes from the normal mode to the power-saving mode, the switch control signal SW temporarily is made high during time t2–t3 as shown in FIG. 4(C). Accordingly, the switch circuit 20 is turned on as shown in FIG. 5A, and the logic state of the node B is written into the memory circuit 10. The character W in FIG. 4(D) denotes this state.

Figure 5B:
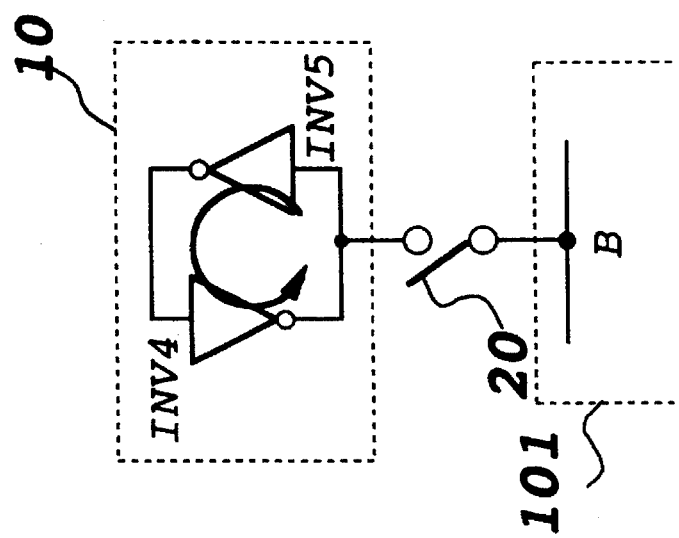
Figure 5A:
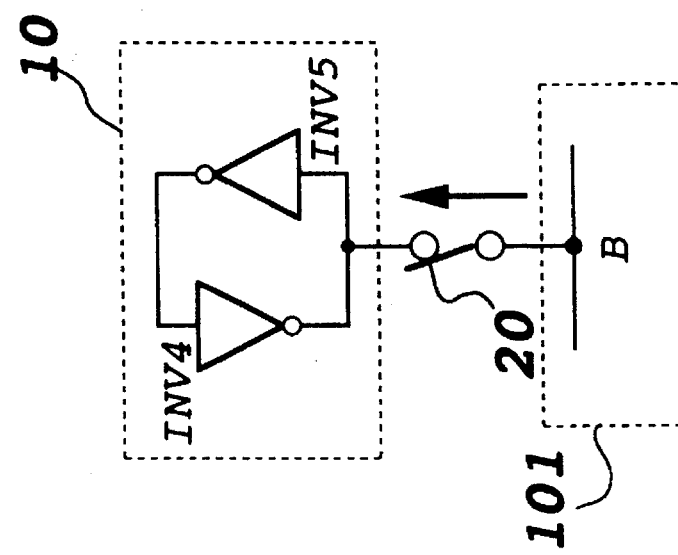

(3) When the logic state of the node B has been written at time t3 in FIG. 4(C), the logic circuit 100 including the latch circuit 101 enters the power-saving mode, and the switch circuit 20 is turned off at time t3 as shown in FIG. 5B. Accordingly, the memory circuit 10 is separated from the node B, thereby having no effect on the node B and retaining the logic state of the node B. The word "HOLD" in FIG. 4(D) designates this state.

(4) When the logic circuit 100 including the latch circuit 101 changes from the power-saving mode to the normal mode, the switch control signal SW is temporarily made high during time t4–t5 as shown in FIG. 4(C). Accordingly, the switch circuit 20 is turned on at time t4 as shown in FIG. 5C. Thus, the memory circuit 10 reads the logic state retained therein, and the logic state of the node B is restored. The character R in FIG. 4(D) denotes this state.

Repeating the operations (1)–(4) makes it possible to hold the logic state of the node B even if the power supply of the logic circuit is turned on and off at random. In addition, the logic state of other nodes can also be held by similar data hold circuits. Accordingly, when the operation mode of the logic circuit 100 is changed from the power-saving mode to the normal mode, the logic state of the latch circuit 101 can be restored to the state at the end of the normal mode.

When the inverters INV4 and INV5 of the memory circuit 10 are constructed by MOS transistors whose threshold levels are higher than those of the other circuits (the switch circuit 20, the control circuit 30, and the latch circuit 101), the leakage of the memory circuit 10 can be reduced to an amount of about 1/1000 of the leakage of the other circuits. In addition, since a high-speed operation is not required of the inverters INV4 and INV5 of the memory circuit 10, power-saving transistors can be used for those inverters. Transistors whose threshold voltage is higher, whose gate length is smaller, and whose entire size is smaller than common transistors have less power consumption at the cost of their reduced operation speed. It is preferable that the memory circuit 10 use these power-saving transistors.

EMBODIMENT 2

Figure 6:
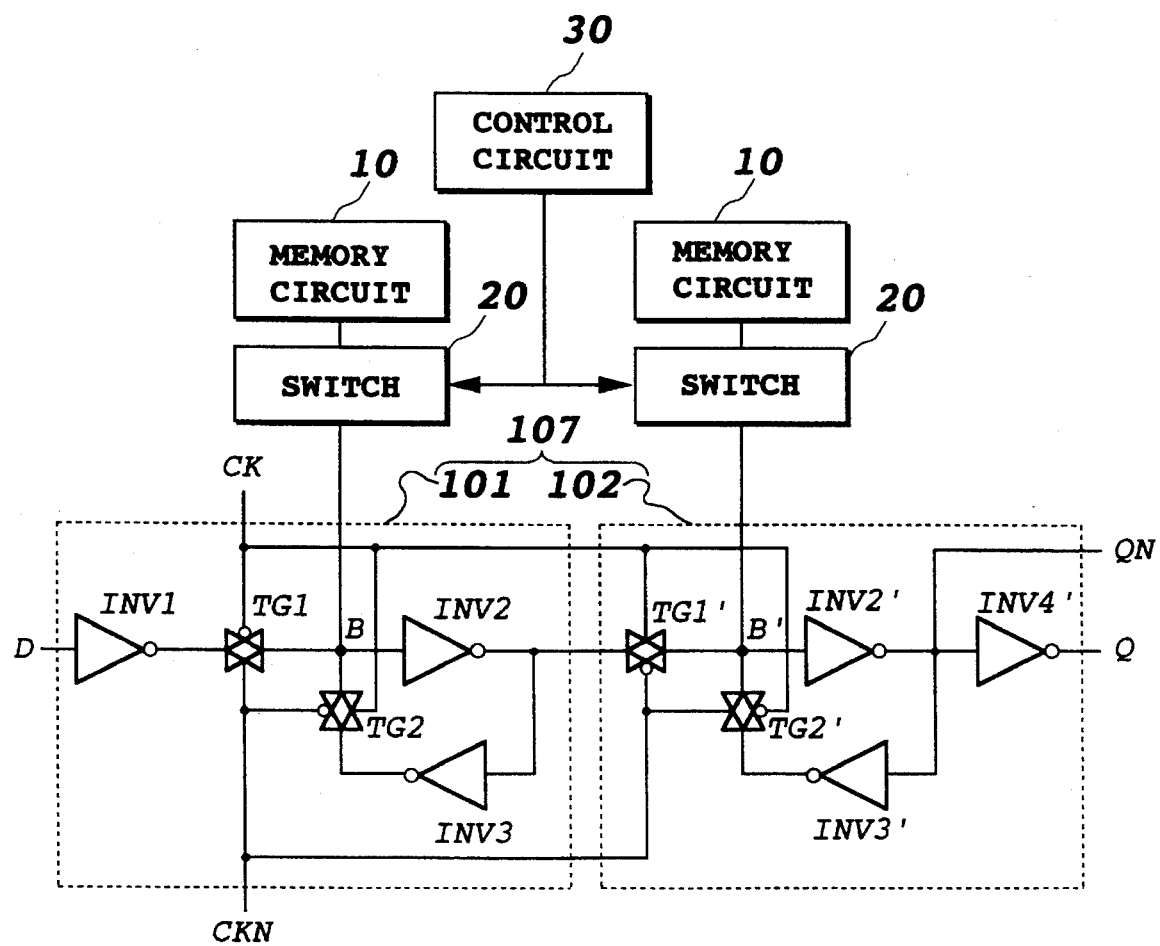
FIG. 6 is a circuit diagram showing a second embodiment of a data hold circuit in accordance with the present invention, which can store and restore the logic state of both nodes B and B' of a D flip-flop arranged by connecting two static latch circuits in cascade.

FIG. 6 shows a second embodiment of a data hold circuit in accordance with the present invention. In this figure, reference numerals 101 and 102 designate latch circuits, which are connected in cascade to constitute a D flip-flop 107.

The latch circuit 101 is the same as the latch circuit of the first embodiment. On the other hand, the latch circuit 102 reads the output of the latch circuit 101 when a transmission gate TG1' is in the ON state, holds the read data by inverters INV2' and INV3' when a transmission gate TG2' is in the ON state, and outputs the held data through an inverter INV4'.

With this arrangement, the transmission gate TG1 is turned on at a first timing when the clock signal CK becomes low, and the latch circuit 101 reads the input data. Subsequently, the transmission gates TG2 and TG1' are turned on at a second timing when the clock signal CK becomes high. Therefore, the latch circuit 101 holds the data, and the latch circuit 102 reads the data. Then, the transmission gate TG2' is turned on at a third timing when the clock signal CK becomes low, and the latch circuit 102 holds the data. As a result, the input data DT is outputted from the inverter INV4' with one clock delay. In other words, the latch circuits 101 and 102 constitute the D flip-flop 107.

In this case, the nodes B and B' whose logic state need to be held are connected to the memory circuits 10 and 10 through the switch circuits 20 and 20, respectively. Since these switch circuits 20 and 20 operate in a similar way, a single control circuit 30 is enough to control the operation of the two switch circuits.

It is sufficient for such a D flip-flop to hold one of the two logic states of the latch circuits 101 and 102. It depends on the clock condition which one of the two logic states should be held. Specifically, when the clock signal CK is high, the logic state of the node B of the latch circuit 101 should be held, whereas when the clock signal CK is low, the logic state of the node B' of the latch circuit 102 should be held.

Figure 7A:
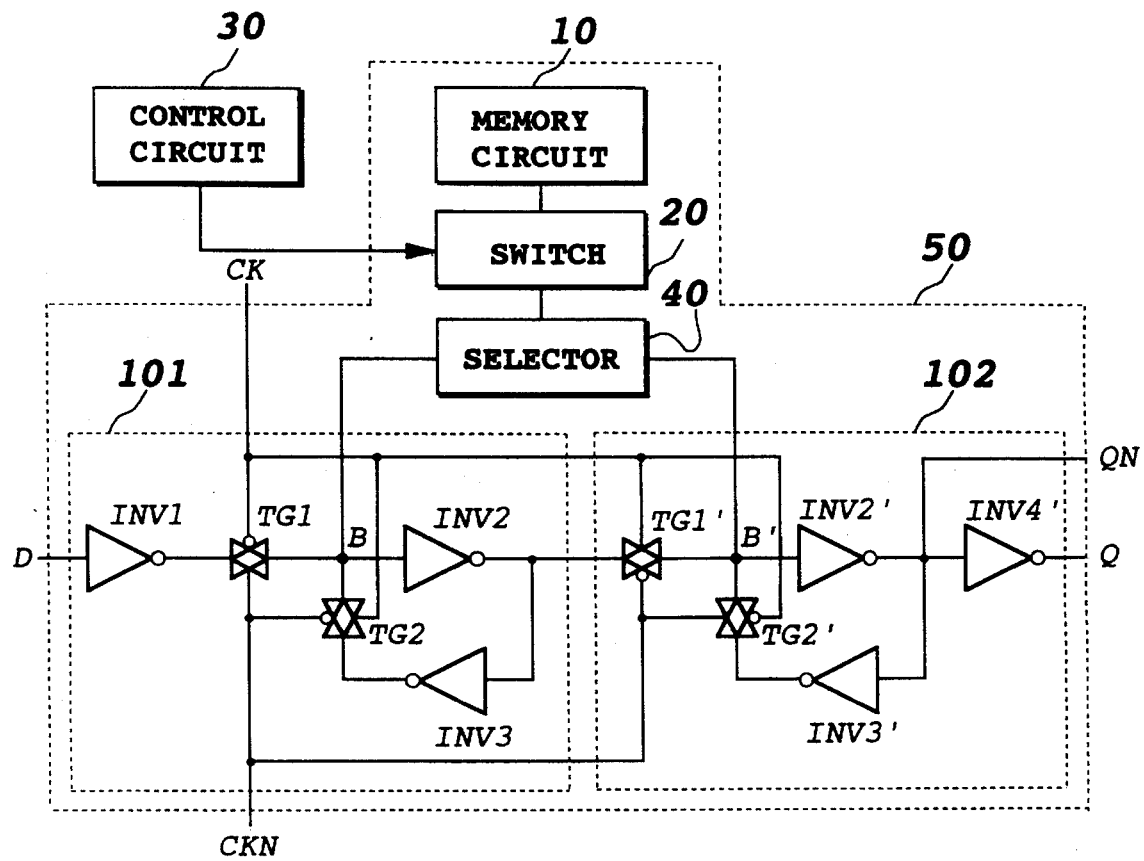
FIGS. 7A and 7B are circuit diagrams showing variations of a second embodiment, which can store and restore the logic state of one of the nodes B and B' of a D flip-flop arranged by connecting two static latch circuits in cascade.

Thus, the respective nodes B and B' of the two latch circuits 101 and 102 may be connected to the single switch 20 through a selector 40 as shown in FIG. 7A, and the switch 20 is connected to the memory circuit 20. The selector 40 selects the node B of the latch circuit 101 when the clock signal CK is high, and the node B' of the latch circuit 102 when the clock signal CK is low. Thus, the latch circuit 101 shares the switch circuit 20 and the memory circuit 10 with the latch circuit 102 through the selector 40. This makes it possible to arrange a D flip-flop 50 including the memory circuit 10. The arrangement of FIG. 7A can reduce the number of components as compared with that of FIG. 6.

Figure 7B:
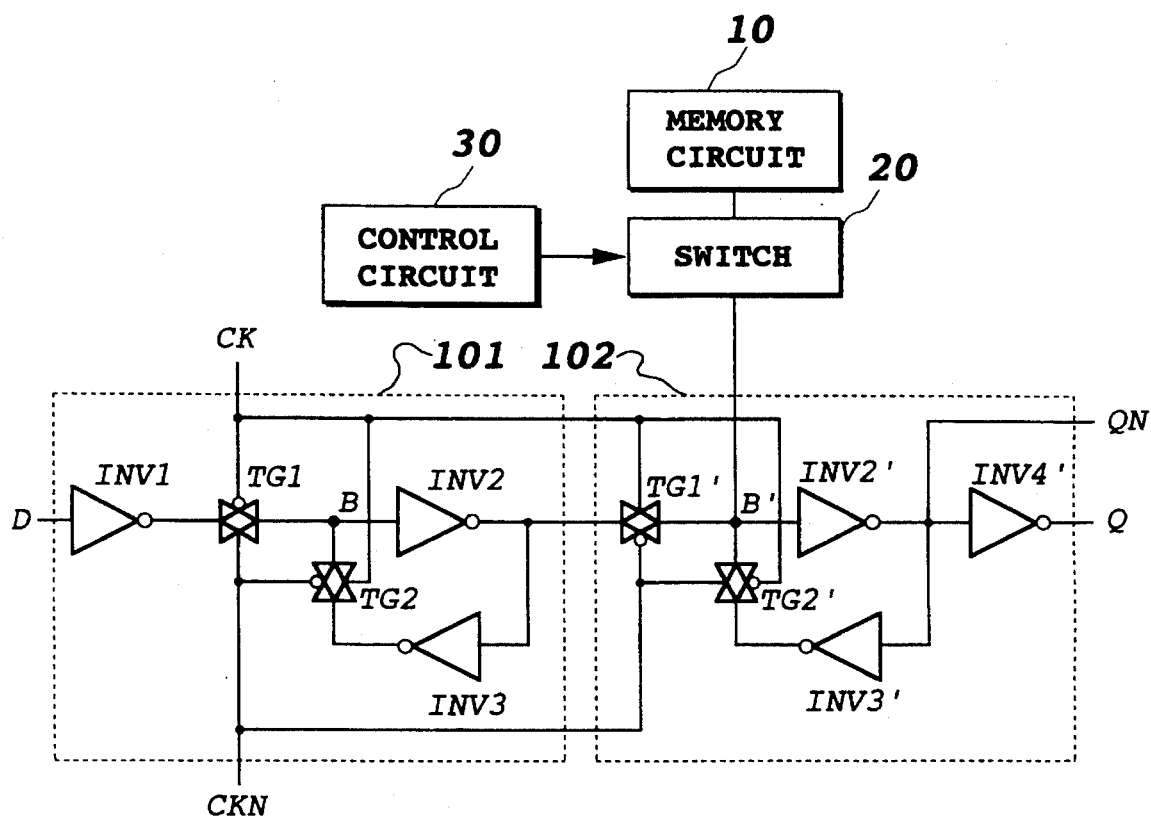

Furthermore, when the level of the clock signal CK can be determined at the power off, the selector circuit 40 can be removed. FIG. 7B is a circuit diagram showing the arrangement of the D flip-flop 50 when the level of the clock signal CK at the power off is low. In this case, the switch circuit 20 is directly connected to the node B' of the latch 102 without using the selector 40.

Figure 8:
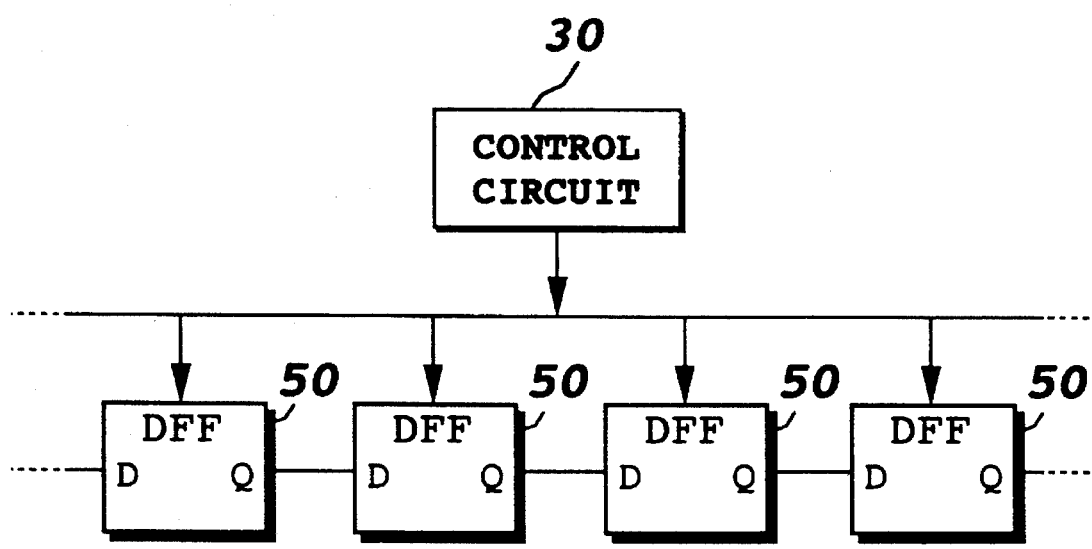
FIG. 8 is a block diagram showing a variation of the second embodiment, which includes a plurality of the D flip-flops of FIG. 7A, and can control the storing and restoring of the logic state of the nodes B and B' of each D flip-flop by a common control circuit.

FIG. 8 shows a shift register constructed by connecting in cascade the D flip-flops as shown in FIG. 7A. A circuit such as a shift register, in which a plurality of D flip-flops operates simultaneously, the single control circuit 30 can be shared among the D flip-flops.

Figure 9:
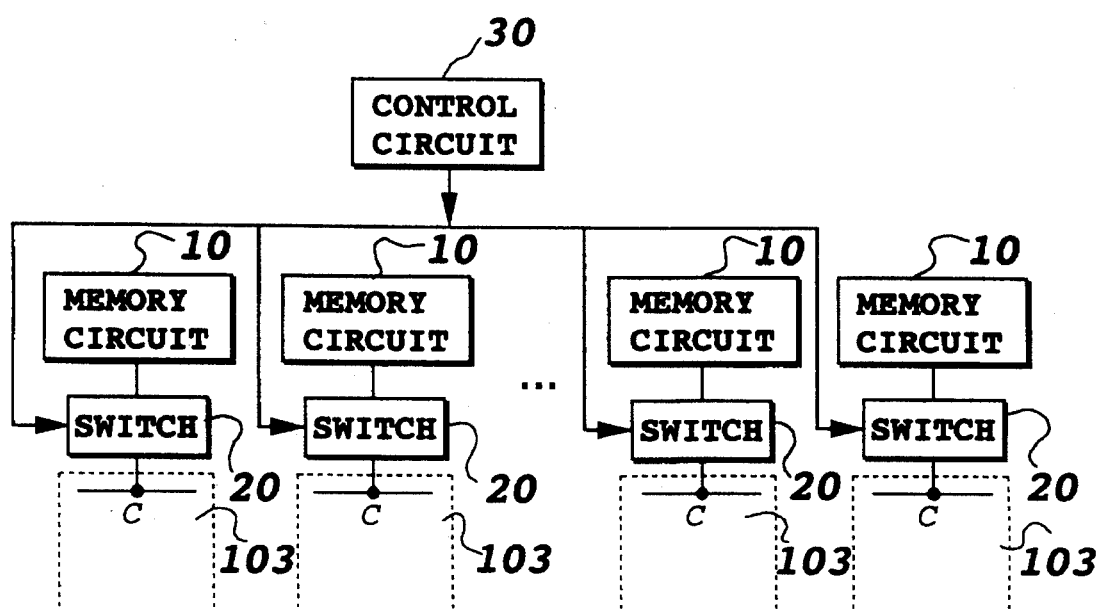
FIG. 9 is a block diagram showing another variation of the second embodiment, which includes a plurality of logic circuits other than D flip-flops, and can control the storing and restoring of the logic state of the node C of each logic circuit by a common control circuit.

FIG. 9 shows a circuit wherein the logic state of a node C of each one of a plurality of logic circuits 103 need to be stored independently. In this case, although the memory circuit 10 and the switch circuit 20 are required for each one of the nodes C, the control circuit 30 can be shared by all the switch circuits. This makes possible to prevent a chip area from being increased.

Figure 10:
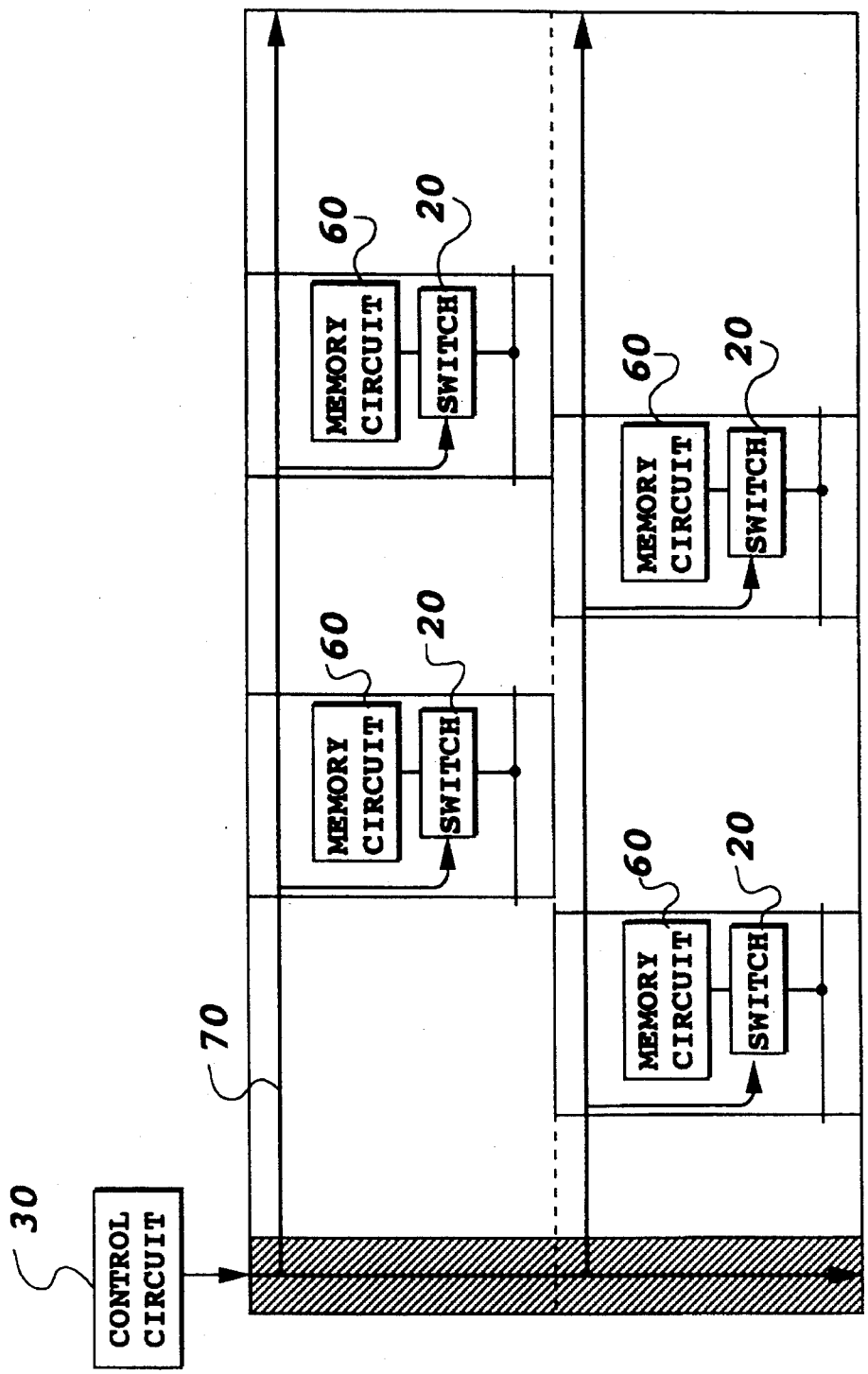
FIG. 10 is a diagram showing a pattern when the circuit of FIG. 9 is implemented by standard cells.

FIG. 10 illustrates a wiring arrangement for the circuit of FIG. 9. When a circuit as shown in FIG. 9 is implemented by standard cells, a bus 70 from the control circuit 30 is provided to pass through individual standard cells 60. With this arrangement, the switch circuit 20 in each cell 60 can receive the switch control signal from the bus 70 in that cell. Accordingly, it is unnecessary to provide individual signal lines directly from the control circuit 30 to the switch circuits 20 in respective cells, which prevents an increase in a chip area and simplifies the design of the circuit.

EMBODIMENT 3

Figure 11:
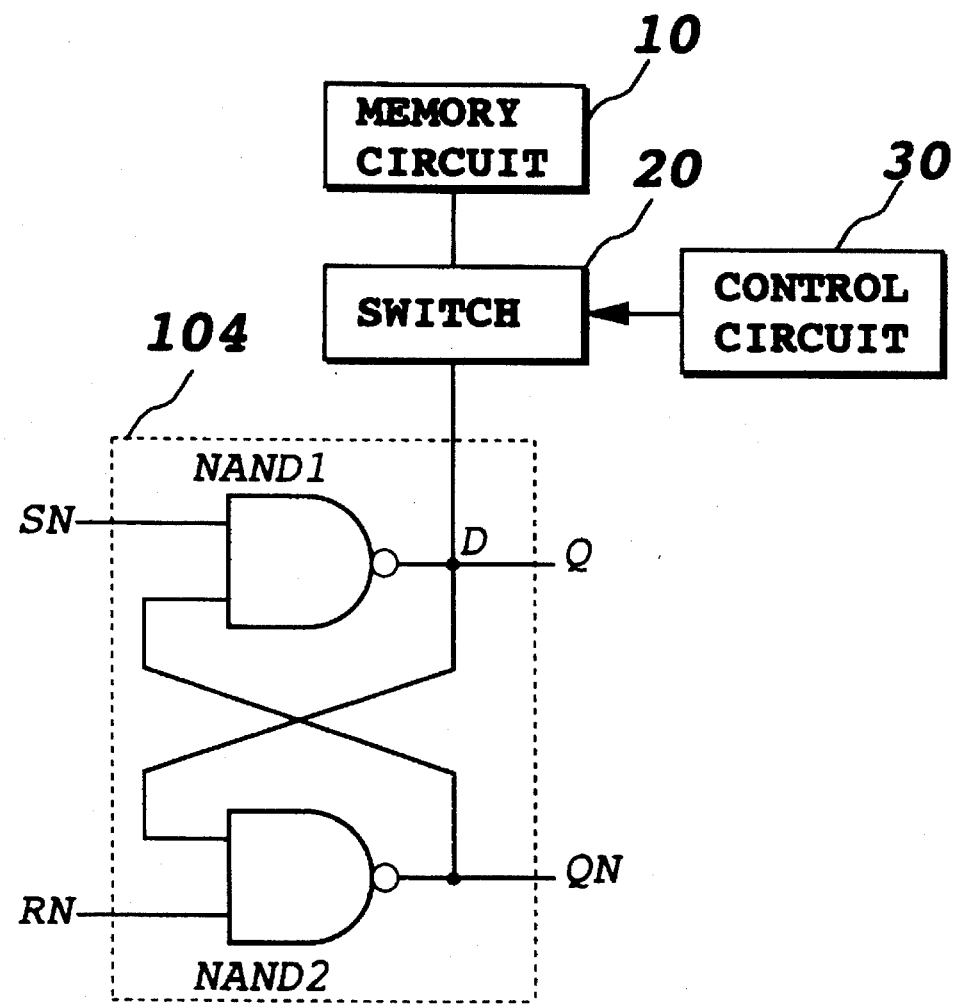
FIG. 11 is a circuit diagram showing a third embodiment of a data hold circuit in accordance with the present invention, which can store and restore the logic state of a node D of an RS flip-flop.

FIG. 11 is a block diagram showing a third embodiment of a data hold circuit in accordance with the present invention. This embodiment uses an RS flip-flop 104 as a part of a logic circuit, and a node D led to the output Q of the flip-flop is connected to the memory circuit 10 via the switch circuit 20.

The RS flip-flop 104 is a known circuit including two NAND gates NAND1 and NAND2. A low-level signal inputted to the set input terminal SN will set the RS flip-flop 104 so that its Q output level becomes high. On the other hand, a low-level signal inputted to the reset input terminal RN will reset the RS flip-flop 104 so that its Q output level becomes low. In addition, when no input is supplied, the flip-flop 104 retains the set state or the reset state, and outputs the retained state from the output terminal Q or QN.

The memory circuit 10 is continuously provided with power from a power supply other than a power supply for the RS flip-flop 104. The switch 20 is turned on and off by the switch control signal from the control circuit 30, thereby connecting or disconnecting the memory to or from the node D. As the memory circuit 10, the switch circuit 20, and the control circuit 30 of this embodiment, those as shown in FIGS. 3B and 3C can be used.

The operation of this embodiment is also carried out in accordance with the waveform diagram of FIG. 4. More specifically, in the normal mode, since the power supply of the RS flip-flop 104 is in the ON state, the flip-flop 104 operates as a common RS flip-flop. In contrast, during the power-saving mode, the power supply to the RS flip-flop is kept OFF. In this case, when the power is changed from the ON state to the OFF state, the switch circuit 20 is made ON for a predetermined time period so that the state of the node D is written into the memory circuit 10. In addition, the switch circuit 20 is made ON for another predetermined time period when the RS flip-flop 104 is returned from the power-saving mode to the normal mode so that the stored content in the memory circuit 10 is set to the node D. Thus, the state of the RS flip-flop 104 is restored to the state immediately before the power off.

In the third embodiment also, since the switch circuit 20 is also kept OFF during the normal mode of the RS flip-flop 104, the memory circuit 10 does not apply a load on the node D. Furthermore, since the switch circuit 20 is kept OFF during the power-saving mode of the RS flip-flop 104, the memory circuit 10 can hold the stored content independently of the RS flip-flop 104.

EMBODIMENT 4

Figure 12:
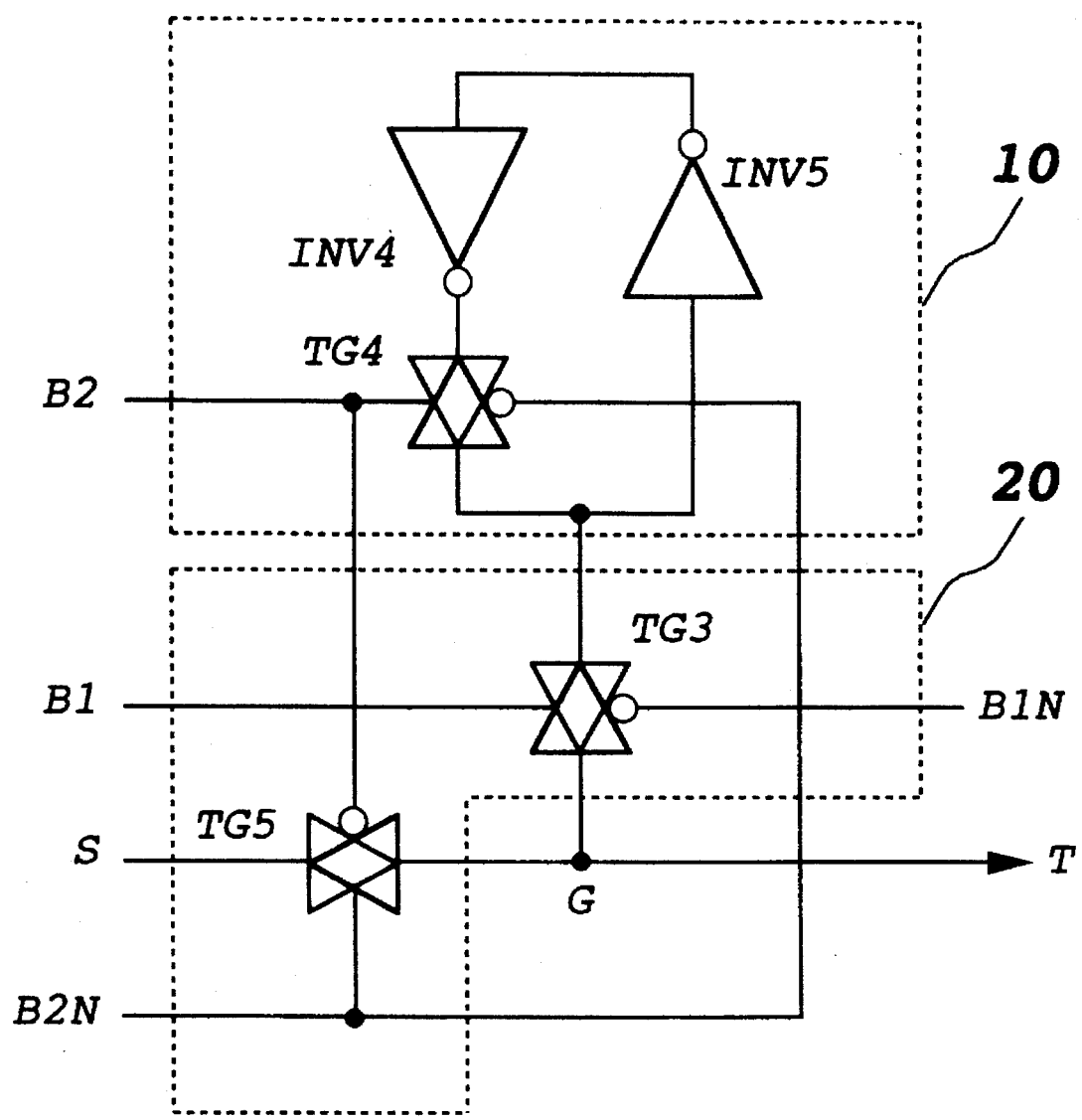
FIG. 12 is a circuit diagram showing a fourth embodiment of a data hold circuit in accordance with the present invention, which can store and restore the logic state of a node G among a series of nodes S, G and T of a logic circuit.
Figure 13:
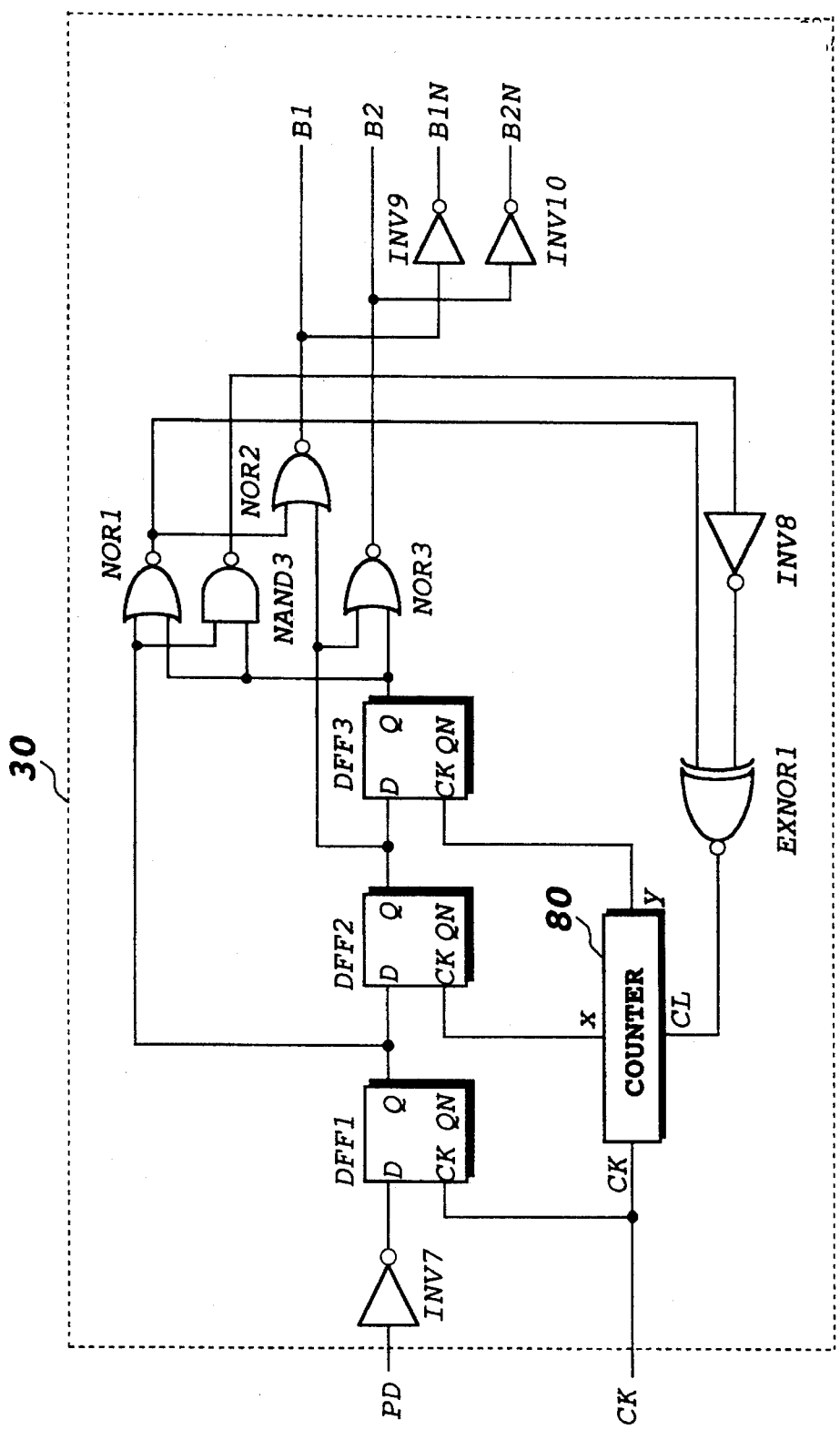
FIG. 13 is a circuit diagram showing a control circuit controlling the switch circuit and memory circuit of FIG. 12.

FIGS. 12 and 13 show a fourth embodiment of the data hold circuit in accordance with the present invention. FIG. 12 is a circuit diagram showing the memory circuit 10 and the switch circuit 20, and FIG. 13 is a circuit diagram showing the control circuit 30.

The configuration of FIG. 12 differs from that of FIG. 3B in the following points.

(1) A transmission gate TG4 is inserted between the output terminal of the inverter INV4 and the input terminal of the inverter INV5 of the memory circuit 10.

The transmission gate TG4 can cut off the output of the inverter INV4. In this case, the data from the transmission gate TG3 in the switch circuit 20 is supplied to the input terminal of the inverter INV5 without a conflict with the output of the inverter INV4 of the memory circuit 10. This facilitates writing of the data to the memory circuit 10.

(2) A transmission gate TG5, which turns on and off complementarily to the transmission gate TG4, is connected between an output node S and an input node T in the logic circuit. Here, data flow from the node S to the node T, and the logic state of a node G, which is joined to the node T and whose logic state should be held, is connected to the memory circuit 10 through the switch circuit 20.

The transmission gate TG5 connects or disconnects between the node G and the node S. Disconnecting the node S from the node G makes it easier to write data in the memory circuit 10 to the node G. In this embodiment, when the operation mode is changed from the normal mode to the power-saving mode, writing of the state of the node G is carried out by turning the transmission gates TG3 and TG5 on, and the transmission gate TG4 off. This makes it possible to prevent the output of the inverter INV4 from interfering with the logic state of the node G, which facilitates the writing of the state of the node G into the memory circuit 10. On the other hand, when the operation mode is changed from the power-saving mode to the normal mode, restoring of the stored content in the memory circuit 10 to the node G is performed by turning the transmission gates TG3 and TG4 on, and the transmission gate TG5 off. This makes it possible to remove the effect of the node S, which facilitates setting of the stored content to the node G.

FIG. 13 is a circuit diagram showing the control circuit 30 for generating control signals B1 and B2 for the transmission gates TG3–TG5, and their negation signals B1N and B2N. The control circuit 30 generates these signals from an operation state detection signal PD.

The control circuit 30 includes a counter 80 which counts pulses of a clock signal CK and outputs signals X and Y at different predetermined count values, and three D flip-flops DDF1, DDF2 and DDF3 which sequentially read the inverted signal of the input signal PD by using the clock signal CK, the signal X and the signal Y. In addition, the control circuit 30 has a NOR gate NOR1 which NORs the Q output of the D flip-flop DFF1 and the Q output of the D flip-flop DFF3, and a NAND gate NAND3 which NANDs the same. Furthermore, the control circuit 30 includes a NOR gate NOR2 which NORs the output of the NOR gate NOR1 and the Q output of the D flip-flop DFF2, and produces the result as the control signal B1, and a NOR gate NOR3 which NORs the Q output of the D flip-flop DFF2 and the Q output of the D flip-flop DFF3, and produces the result as the control signal B2. In addition, the control circuit 30 has inverters INV9 and INV10 which invert the control signals B1 and B2, and an exclusive NOR gate EXNOR1 which produces a clear signal CL when the output of an inverter INV8 which inverts the output of the NAND gate NAND3 and the output of the NOR gate NOR1 coincides.

Figure 14:
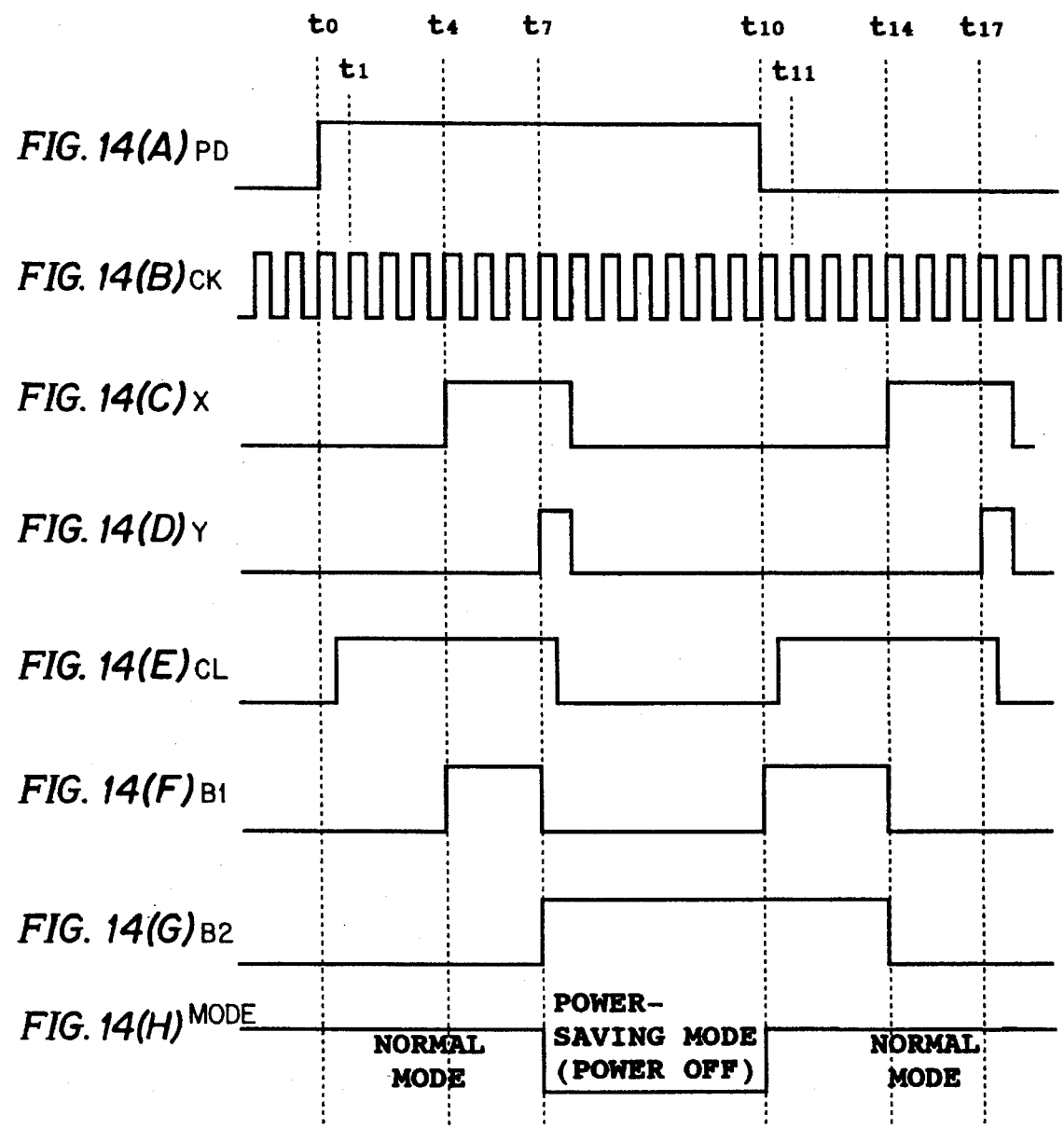
FIGS. 14(A) to 14(H) are waveform charts illustrating the operation of the control circuit of FIG. 13.

FIG. 14 is a time chart illustrating the operation of the control circuit 30. In FIG. 14, the signal X is generated at time t4 when the counter 80 counts four pulses of the clock signal CK, and the signal Y is generated at time t7 when the counter 80 counts seven pulses. Incidentally, the pulse of the clock signal CK is not counted at times t0 and t10 in FIG. 14 because the clear signal CL is effective at these times, and the counting starts at times t1 and t11 when the clear signal CL becomes ineffective.

As shown in FIG. 14(H), when the operation is switched from the normal mode to the power-saving mode, that is, when the power is changed from the ON state to the OFF state, the operation state detection signal PD changes from low to high, and the output of the inverter INV7 changes in the opposite direction from high to low. Incidentally, although the duration from time t0, at which the signal PD rises, to time t7, at which the normal mode ends, is drawn as if it were considerably long, it actually is very short. At times t1, t4 and t7, at which the clock signal CK, the signal X and the signal Y sequentially rise as shown in (A)–(D) of FIG. 14, the Q outputs of the D flip-flops DFF1–DFF3 sequentially change from high to low.

In this case, the output of the NOR gate NOR1 is kept low before time t7, and changes to high at time t7, at which both the inputs to the NOR gate NOR1 become low. Accordingly, the control signal B1, that is, the output of the NOR gate NOR2 is kept high from time t4, at which the Q output of the D flip-flop DFF2 is changed to low by the signal X, to time t7 as shown in (F) of FIG. 14. On the other hand, the control signal B2, that is, the output of the NOR gate NOR3 is changed to high at time t7, at which the Q output of the D flip-flop DFF3 is changed to low by the signal Y, and keeps this state thereafter as shown in FIG. 14(G). In addition, the clear signal CL to the counter 80 is high from time t0 to time t7, during which the outputs of the D flip-flops DFF1 and DFF3 are different, as shown in FIG. 14(E).

Next, when the operation is switched from the power-saving mode to the normal mode, that is, when the power is changed from the OFF state to the ON state, the operation state detection signal PD changes from high to low, and the output of the inverter INV7 changes in the opposite direction from low to high. At times t11, t14 and t17, the Q outputs of the D flip-flops DFF1–DFF3 sequentially change from low to high by the clock signal CK, the signal X and the signal Y.

The output of the NOR gate NOR1 is high only when the Q outputs of the D flip-flops DFF1 and DFF3 are both low. Thus, the output of the NOR gate NOR1 falls low at time t10, at which the Q output of the D flip-flop DFF1 becomes high by the clock signal CK. Accordingly, the control signal B1, that is, the output of the NOR gate NOR2 is kept high from time t10 to time t14, at which the Q output of the D flip-flop DFF2 becomes low, as shown in (F) of FIG. 14. On the other hand, the control signal B2, that is, the output of the NOR gate NOR3 falls to low at time t14, at which the Q output of the D flip-flop DFF2 becomes high, as shown in FIG. 14(G). In addition, the clear signal CL to the counter 80 is high from time t10 to time t17, during which the outputs of the D flip-flops DFF1 and DFF3 are different as shown in FIG. 14(E). Thus, the signals as shown in FIG. 14 are generated, thereby controlling the switch circuit 20 and the memory circuit 10 shown in FIG. 12.

EMBODIMENT 5

Figure 15:
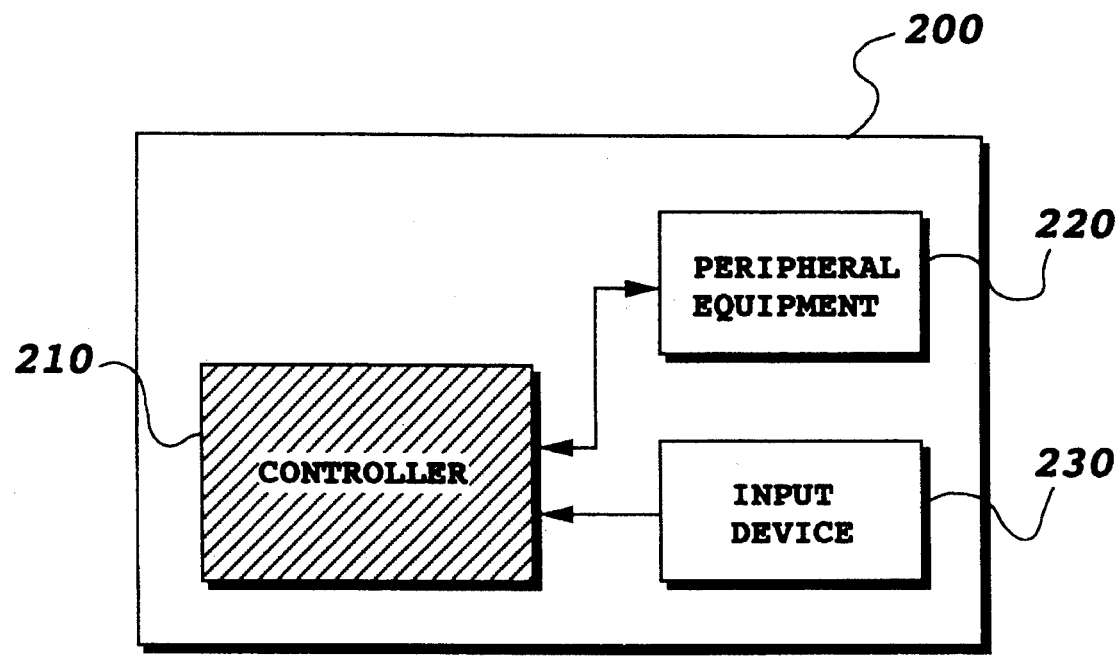
FIG. 15 is a block diagram showing a fifth embodiment in accordance with the present invention, which is a first application of the data hold circuit in accordance with the present invention.

FIG. 15 shows an embodiment in which the data hold circuit in accordance with the present invention is applied to a portable data terminal such as a PDA (Personal Digital Assistant), a pager, an electronic note, or a portable telephone.

In FIG. 15, a portable data terminal 200 comprises a controller 210 including a CPU, peripheral equipment 220 including a mass storage and a display unit, and an input device 230 including a keypad. The controller 210 employs a data hold circuit in accordance with the present invention, processes input data from the input device 230 and data stored in the peripheral equipment 220, and displays or stores the result to the peripheral equipment 220. The input device 230, which is basically provided for inputting data, is also used to supply the controller 210 with the operation state detection signal PD which takes the high level when no input operation occurs for a predetermined time period.

Since the portable data terminal of this type is supplied with power from a battery, power saving of the circuit is important. In addition, since waiting times are much longer than operating times in the controller 210, large power saving can be expected by turning the power off during waiting times.

In a conventional portable data terminal, since it is necessary to save data held by D flip-flops or the like into a storage before the power of a controller is turned off, it takes rather a long processing time before the power is turned off. In contrast, since the controller 210 automatically holds the logic states of D flip-flops or the like in this embodiment, the power to the controller 210 can be easily turned on and off in a short time. This facilitates the power saving of the controller 210, and lengthens a continuous operation time.

EMBODIMENT 6

Figure 16:
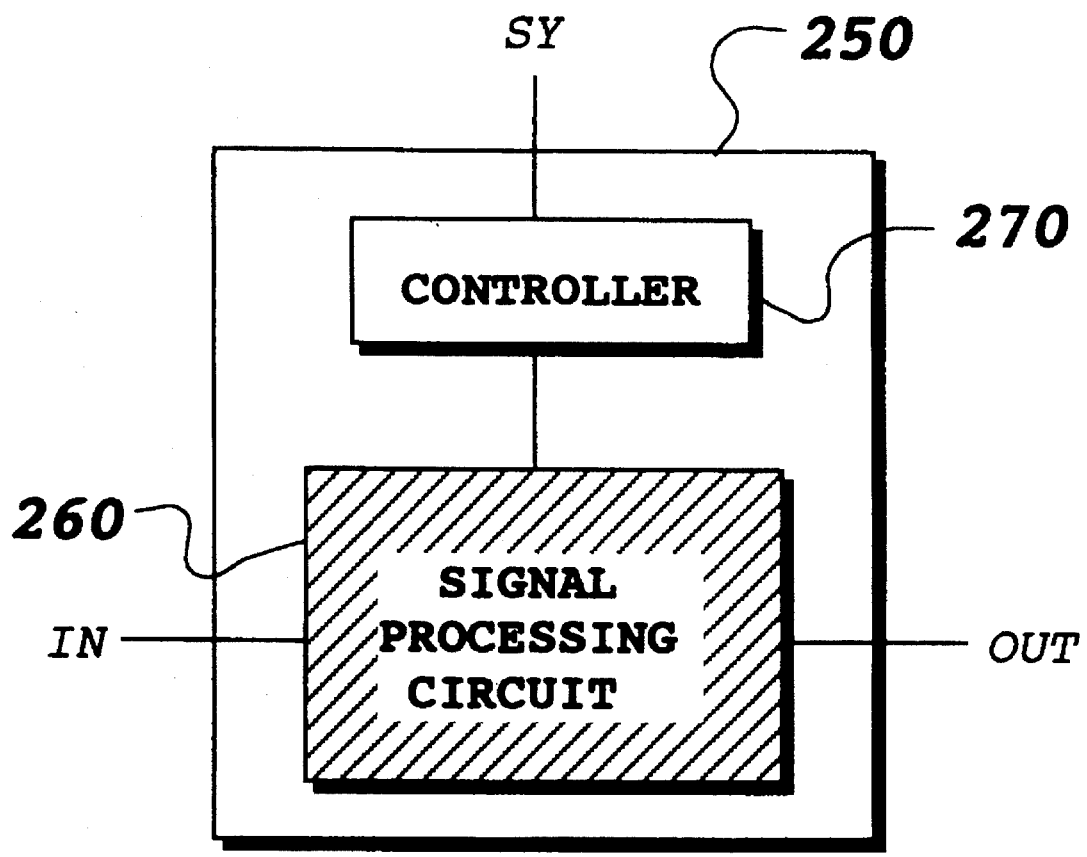
FIG. 16 is a block diagram showing a sixth embodiment in accordance with the present invention, which is a second application of the data hold circuit in accordance with the present invention.

FIG. 16 shows a signal processing device 250 employing the data hold circuit in accordance with the present invention.

Figure 17:
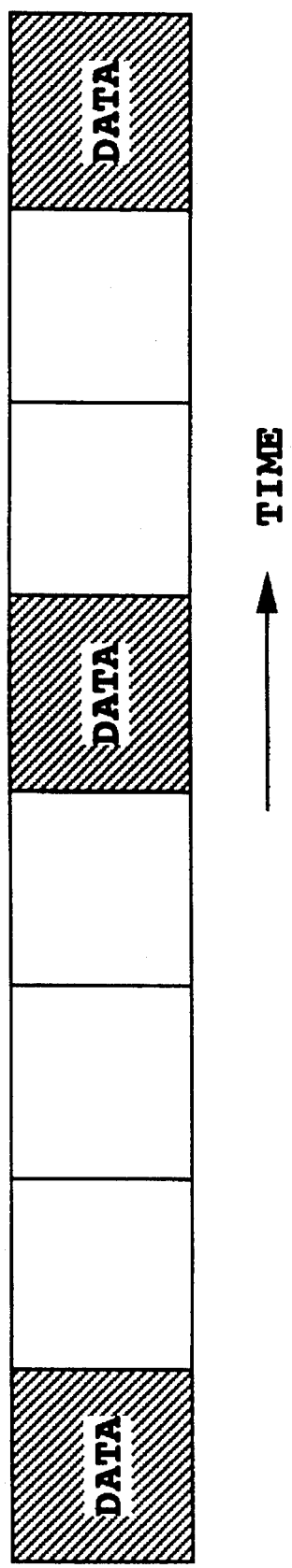
FIG. 17 is a schematic diagram showing data format to be processed by the system of FIG. 16.

In FIG. 16, a signal processing circuit 260, which uses the data hold circuit in accordance with the present invention, receives time-division multiplexing data as shown in FIG. 17, and carries out processing of the data. The signal processing circuit 260 is connected to a controller 270, which generates, from a synchronizing signal SY for data recovery, the operation state detection signal PD which is used for turning on and off the power of the signal processing circuit 260. The power of the signal processing circuit 260 is made on only during the time periods associated with the shaded sections of the data in FIG. 17, which indicate the data addressed to this signal processing device 250. More specifically, the power of the signal processing circuit 260 is made ON during these time periods by making the operation state detection signal PD low, and is made OFF during the other time periods by making the operation state detection signal PD high.

Effects similar to those of the fifth embodiment can also be expected in this embodiment.

EMBODIMENT 7

Figure 18A:
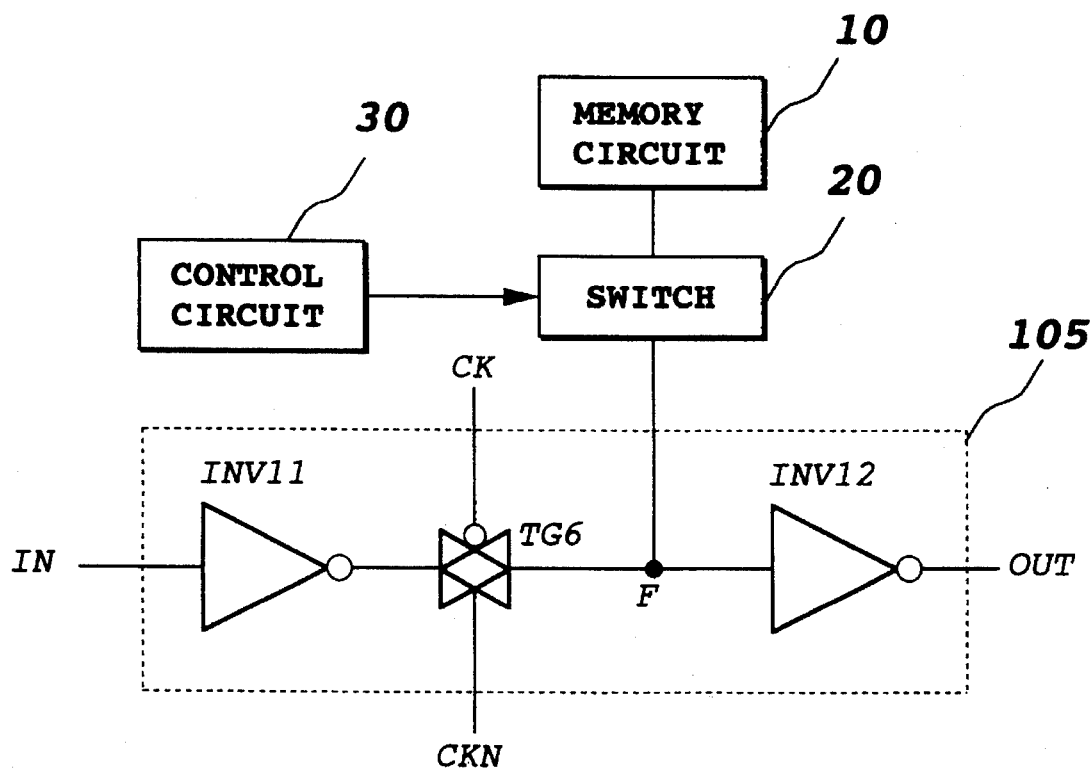
FIG. 18A is a circuit diagram showing a seventh embodiment of a data hold circuit in accordance with the present invention, which can store and restore the logic state of a node F of a dynamic latch circuit.
Figure 18B:
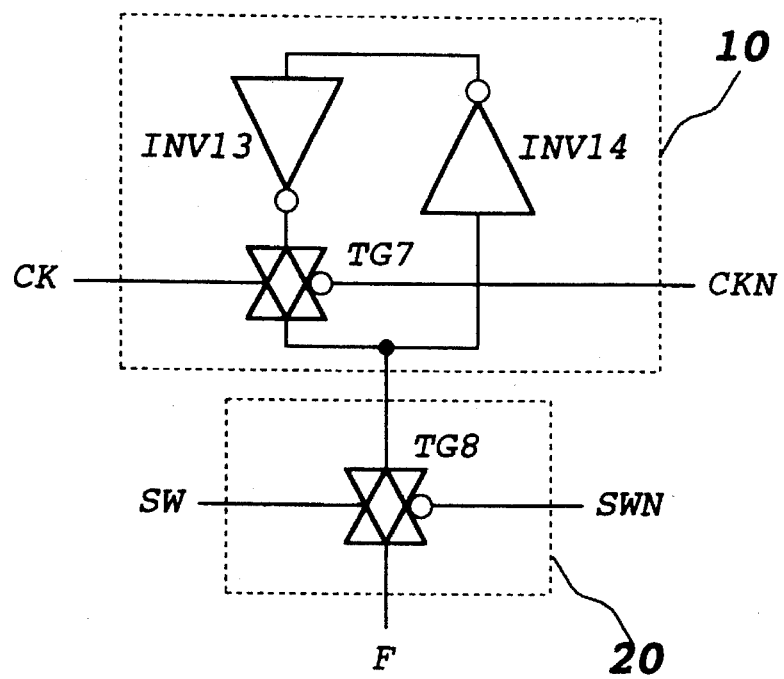
FIG. 18B is a circuit diagram showing a memory circuit and a switch circuit of the data hold circuit of FIG. 18A.
Figure 18C:
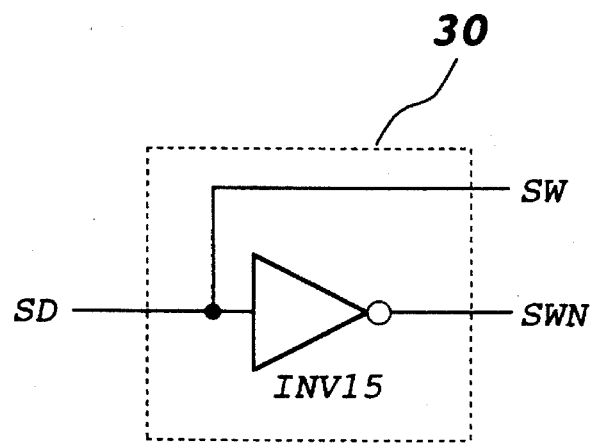
FIG. 18C is a circuit diagram showing a control circuit of the data hold circuit of FIG. 18A.

FIGS. 18A–18C are circuit diagrams showing a seventh embodiment of a data hold circuit in accordance with the present invention. This embodiment uses a dynamic latch circuit 105 as a logic circuit. In the normal mode, the dynamic latch circuit 105 operates at a high speed as a dynamic circuit. The operation in the power-saving mode, on the other hand, is divided into first and second power-saving operation modes. In the first power-saving operation mode, which uses a clock frequency lower than that in the normal mode, the dynamic latch circuit 105 is connected to the memory circuit 10, thereby forming a static latch circuit suitable for a low speed operation. In the second power-saving operation mode, during which the power to the dynamic latch circuit 105 is kept off, the node state immediately before the power off is written into the memory circuit 10, which is a similar to the operation of the first embodiment.

Thus, in this embodiment, the latch circuit 105 operates as a dynamic circuit during the normal mode to meet the requirement of a high speed operation, and operates as a static circuit during the power-saving mode to meet the requirement of the low speed operation or the power off. This makes it possible to simultaneously solve the problems in that the static latch circuit is slow in operation, and the dynamic latch circuit does not operate at a low speed.

FIG. 18A shows a latch circuit 105 including an inverter INV11, a transmission gate TG6, and an inverter INV12, which are connected in cascade. When the clock signal CK to the transmission gate TG6 becomes low, the input data IN is read through the inverter INV11. The read data is latched by a capacitance due to the gate and wiring of MOS transistors constituting the inverter INV12, and is produced from the output terminal of the inverter INV12. In other words, the latch circuit 105 functions as a dynamic circuit. In this case, the node whose logic state should be held in the latch operation is the node F connected to the input terminal of the inverter INV12. Thus, the node F is connected to the memory circuit 10 via the switch circuit 20.

The switch circuit 20 connects or disconnects between the memory circuit 10 and the node F by the switch control signal from the control circuit 30.

FIG. 18B is a circuit diagram showing the memory circuit 10 and the switch circuit 20. The memory circuit 10 includes an inverter INV13, an inverter INV14 and a transmission gate TG7 arranged in a manner similar to that of FIG. 12. The switch circuit 20 has an arrangement similar to that of FIG. 3B, and includes a transmission gate TG8.

FIG. 18C is a circuit diagram showing the control circuit 30. The control circuit 30 is equivalent to the control circuit as shown in FIG. 3C minus the waveform converter 32, and generates the switch control signal SW and its negation signal SWN from the operation state detection signal SD inputted to the inverter INV15. The signal SD, which is supplied from the operation state detection circuit as shown in FIG. 3A to the control signal 30, is kept high during the power-saving mode as shown in FIG. 19(B).

Next, the operation of the embodiment will be described.
(1) The operation in the normal mode.

Figure 20A:
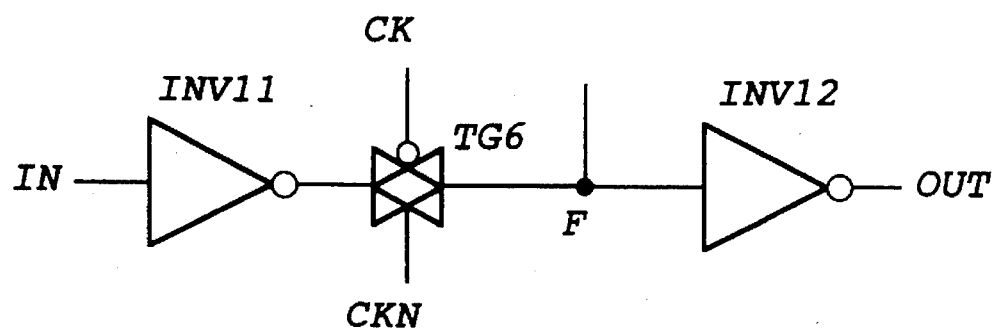
FIG. 20A is a circuit diagram showing the arrangement of the latch circuit of FIG. 18A when the switch circuit is in the OFF state.

In the normal mode, the switch circuit 20 is kept off because the operation state detection signal SD is low as shown in FIG. 19(B). Thus, the memory circuit 10 is disconnected from the node F, and the latch circuit 105 functions as a dynamic circuit as shown in FIG. 20A.

In this case, the load upon the node F due to memory circuit 10 is determined by the transmission gate TG8, and is very small. In addition, the load upon the inverter INV11 is one due to the transmission gate TG8 plus one due to the transmission gate TG6 and the inverter INV12, which is very small. Accordingly, the latch circuit 105 operates as a normal dynamic latch circuit, which makes a high speed operation possible.
(2) The operation in the first power-saving mode.

Figure 20B:
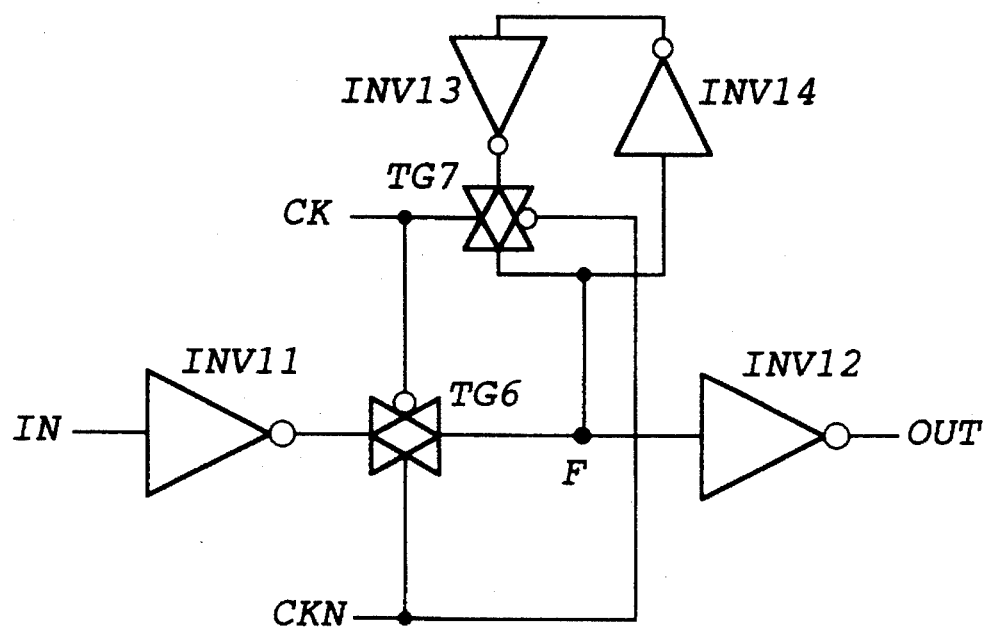
FIG. 20B is a circuit diagram showing the arrangement of the latch circuit of FIG. 18A when the switch circuit is in the ON state.

In the first power-saving mode, the frequency of the clock signal CK is made lower than that in the normal mode. In this case, the operation state detection signal SD becomes high as shown in FIG. 19(B), and the switch circuit 20 turns on. As a result, the memory circuit 10 is connected to the node F, and is combined with the latch circuit 105, thereby forming a static circuit as shown in FIG. 20B. The static circuit has the same arrangement as the static latch circuit 101 shown in FIG. 3A, and operates in the same manner. This ensures a correct operation while the frequency of the clock signal CK is reduced, and the state of the node F is kept.
(3) The operation in the second power-saving mode.

In the second power-saving mode, the power to the latch circuit 105 is kept off. When the power is changed from ON to OFF state, or from OFF to ON state, the switch circuit 20 is kept on for a predetermined time as shown in FIG. 4. The power to the memory circuit 10, however, is kept ON continuously. Accordingly, the logic state of the latch 105 at the end point in the normal mode is stored in the memory circuit 10, and is restored to the node F at the point when the power-saving mode is switched to the normal mode. The operation is the same as that of the first embodiment.

FIG. 21 shows a variation of the control circuit 30. This control circuit is constructed by connecting a latch circuit similar to the dynamic latch circuit 105 as shown in FIG. 18A to the input terminal of the inverter INV15 as shown in FIG. 18C. More specifically, the latch circuit, which includes an inverter INV16, a transmission gate TG9 and the inverter INV17, is connected to the input terminal of the inverter INV15. This makes it possible to switch from the static operation to the dynamic operation, or vice versa, more smoothly because the operation state detection signal SD is latched.

Moreover, automatic switching between the static operation and the dynamic operation in response to the clock frequency becomes possible by connecting an operation speed detection device to the input terminal of the control circuit 30. The operation speed detection device produces the operation state detection signal SD which is low while the clock frequency is higher than a particular frequency (100 MHz, for example), and which is high while the clock frequency is lower than the particular frequency. More specifically, the switch circuit 20 is turned off by the low signal SD when the clock frequency is high so that the latch circuit 105 operates as a dynamic circuit. Conversely, the switch circuit 20 is turned on by the high signal SD when the clock frequency is low so that the latch circuit 105 operates as a static circuit.

Figure 22:
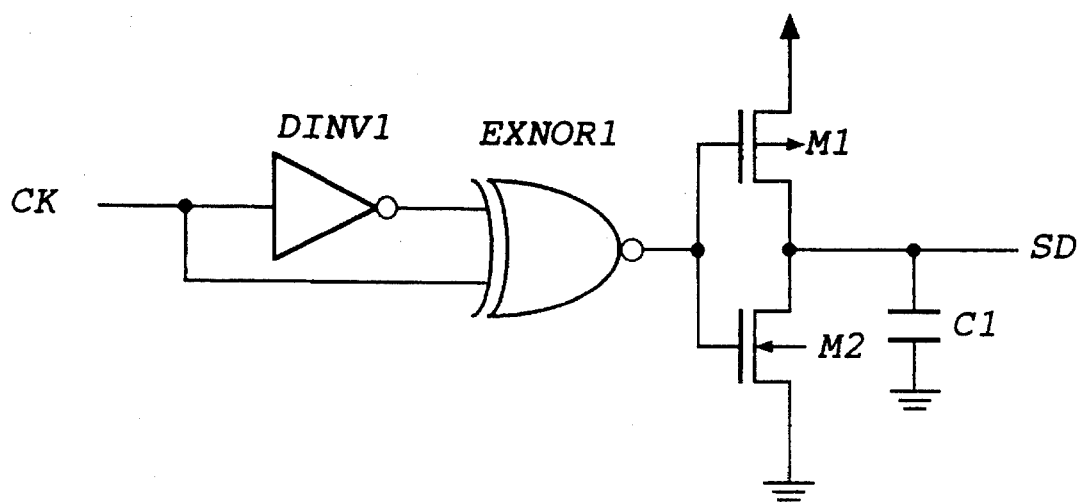
FIG. 22 is a circuit diagram showing an operation speed detection circuit for detecting the operation speed of a circuit from its clock signal.

FIG. 22 is a circuit diagram showing an example of the operation speed detection device. The clock signal CK is supplied to a first input terminal of an exclusive NOR gate (coincidence circuit) EXNOR1, and to the input terminal of a delay inverter DINV1, and the output of the delay inverter DINV1 is supplied to a second input terminal of the exclusive NOR gate EXNOR1. The output of the exclusive NOR gate EXNOR1 is supplied to an inverter consisting of MOS transistors M1 and M2. The inverter inverts the signal and outputs it as the signal SD. A capacitor C1 connected to the output of the inverter is a smoothing capacitor.

Figure 23:
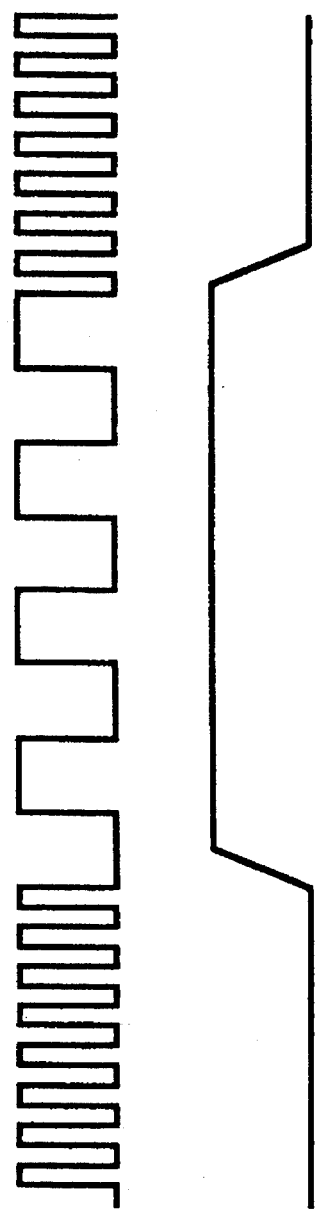
FIGS. 23(A) and 23(B) are waveform charts illustrating the operation of the operation speed detection circuit of FIG. 22.

FIG. 23 is a waveform chart illustrating the operation of the operation speed detection device. When the clock frequency is higher than the particular frequency, the output of the exclusive NOR gate EXNOR1 is high, and hence, the inverter consisting of the MOS transistor M1 and M2 outputs the low signal SD. On the other hand, when the clock frequency is lower than the particular frequency is lower than the particular frequency, the output of the exclusive NOR EXNOR1 is low, and hence, the inverter consisting of the MOS transistor M1 and M2 outputs the high signal SD. In other words, when the clock frequency is higher than the particular frequency, the switch control signal SW is low, and the memory circuit 10 is disconnected from the latch circuit 105, whereas when the clock frequency is lower than the particular frequency, the switch control signal SW is high, and the memory circuit 10 is connected to the latch 105.

EMBODIMENT 8

Figure 24:
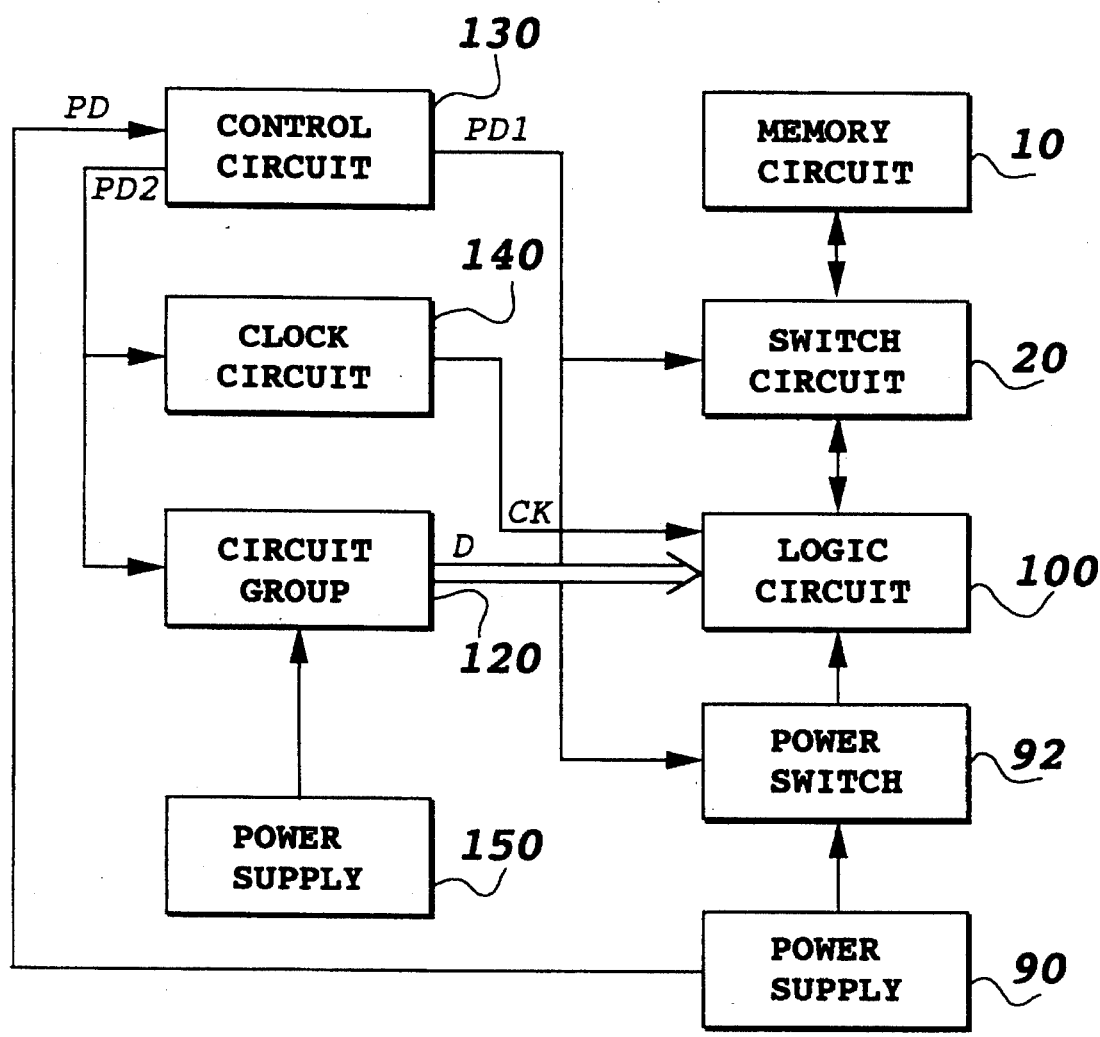
FIG. 24 is a block diagram showing an eighth embodiment of a data hold circuit in accordance with the present invention, which can store and restore the logic state of a logic circuit connected to other circuit group.

FIG. 24 is a block diagram showing an eighth embodiment. This embodiment is arranged by connecting output terminals of a circuit group 120 to input terminals of the logic circuit 100 of the embodiments described above. The logic circuit 100 is supplied with power from the power supply 90 via the power switch 92. The power switch 92 is turned on and off by a control signal PD1 from the control circuit 130, thereby turning on and off the power to the logic circuit 100.

The output data D from the circuit group 120, that is, the input data to the logic circuit 100, must be locked before the normal mode is switched to the power-saving mode. In other words, the input data D must stop its changes in the logic state before the power to the logic circuit 100 is turned off. Conversely, when the logic circuit 100 is switched from the power-saving mode to the normal mode, the power switch 92 must be turned on first to start the power supply to the logic circuit 100, and then, the locked state of the output data D of the circuit group 120 must be released.

This embodiment has a control circuit 130 for controlling such a sequence. The control circuit 130 generates, from the operation state detection signal PD supplied from the power supply 90, the signal PD1 which is supplied to the switch circuit 20 and the power switch 92, and a signal PD2 which is supplied to the circuit group 120 and a clock circuit 140. Here, the clock circuit 140 is a circuit which supplies the logic circuit 100 with the clock signal CK. The circuit group 120 is continuously supplied with power from a power supply 150.

FIG. 25 is a time chart illustrating the operation of the control circuit 130. The operation state detection signal PD commands the power off at the high level and the power off at the low level as in FIG. 4. When the operation state detection signal PD rises at time t0 in the transition from the normal mode to the power-saving mode as shown in FIG. 25(A), the control signal PD2 rises at the same time as shown in FIG. 25(C), so that the change in the state of the output data D from the circuit group 120 and that of the clock signal from the clock circuit 140 are stopped. Subsequently, the control signal PD1 rises at time t1, and holds the high level for a predetermined time T1 as shown in FIG. 25(B). Accordingly, the switch circuit 20 is made on for the time T1 so that the logic states of the nodes of the logic circuit 100 are written to the memory circuit 10. Then, the power switch 92 is turned off at time t2, and the power from the power supply 90 to the logic circuit 100 is interrupted.

On the other hand, when the operation state detection signal PD falls to the low level at time t3 in the transition from the power-saving mode to the normal mode, the power switch 92 is turned on again at time t3 as shown in FIG. 25(D), and the supply of power from the power supply 90 to the logic circuit 100 is restarted. In addition, since the control signal PD1 is made on for a predetermined time T2 from time t3 to t4 as shown in FIG. 25(B), the switch circuit 20 is made on so that the contents of the memory circuit 10 are restored to the respective nodes of the logic circuit 100. Subsequently, the control signal PD2 falls to the low level at time t5 as shown in FIG. 25(C), so that the locked state of the output data D from the circuit group 120 is released.

According to the operation, the logic state of the input data D to the logic circuit 100 from the circuit group 120, and the logic state of the nodes of the logic circuit 100 are restored during the transition from the power-saving mode to the normal mode. As a result, the logic circuit 100 can continue its operation correctly without being affected by the power off.

The control signal PD1 may be held high throughout the time t1 to t4. In this case, although the nodes of the logic circuit 100 are kept connected to the memory circuit 10 because the switch circuit 20 is kept on, it presents little problem as long as the leakage of the logic circuit 100 due to the memory circuit 10 is very small.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A data hold circuit connected to a logic circuit which has a normal mode and a power-saving mode as operation modes, said logic circuit operating normally in the normal mode, and performing power saving in the power-saving mode by interrupting power to the logic circuit or by reducing a clock frequency of the logic circuit, said data hold circuit comprising:

a memory circuit which is continuously supplied with power, at least 1-bit data being writable into and readable from said memory circuit;

a switch circuit including at least one switch element connected between a predetermined node in said logic circuit and said memory circuit; and a control circuit controlling said switch circuit, said control circuit holding said switch element in an off state in said normal mode, holding said switch element in an ON state at least for a first predetermined time period at a transition from said normal mode to said power-saving mode, and holding said switch element in an ON state at least for a second predetermined time period at a transition from said power-saving mode to said normal mode.

2. The data hold circuit as claimed in claim 1, wherein said control circuit holds said switch element in an off state in said power-saving mode after said first predetermined time period has elapsed, and said memory circuit stores a logic state of said node in said first predetermined time period, and supplies said node with the content stored in said memory circuit in said second predetermined time period.

3. The data hold circuit as claimed in claim 2, further comprising an operation state detection circuit which detects an operation state of said logic circuit and produces an operation state detection signal, wherein said control circuit generates a signal defining said first predetermined time period and said second predetermined time period on the basis of said operation state detection signal.

4. The data hold circuit as claimed in claim 2, wherein said memory circuit comprises a first inverter whose input terminal is connected to said switch element, and a second inverter whose input terminal is connected to an output terminal of said first inverter, and whose output terminal is connected to the input terminal of said first inverter.

5. The data hold circuit as claimed in claim 2, wherein switch circuit comprises a plurality of switch elements, each of said switch elements being connected between a particular node of said logic circuit and one of said switch elements in said memory circuit, and said control circuit controls all of said switch elements at the same time.

6. The data hold circuit as claimed in claim 5, wherein said logic circuit comprises a shift register including a plurality of D flip-flops, and each bit of said memory circuit is connected to a node representing the logic state of each one of said D flip-flops via said each one of said switch elements.

7. The data hold circuit as claimed in claim 5, wherein said memory circuit and said switch circuit are formed by arranging a plurality of cells, each of said cells including a memory element storing 1-bit data, and a switch element connected between said memory element and one of said nodes, and wherein a bus line from said control circuit is passed through each one of said cells.

8. The data hold circuit as claimed in claim 3, wherein said memory circuit comprises a first inverter whose input terminal is connected to said switch element, a second inverter whose input terminal is connected to an output terminal of said first inverter, and a transmission gate whose first terminal is connected to an output terminal of said second inverter and whose second terminal is connected to the switch element, said transmission gate being kept off during said first predetermined time period, and kept on during said second predetermined time period.

9. The data hold circuit as claimed in claim 8, wherein said control circuit comprises a counter counting a clock signal, a plurality of D flip-flops sequentially reading the operation state detection signal in response to count values of said counter, and a gate circuit generating, on the basis of outputs of said D flip-flops, a signal defining said first predetermined time period and said second predetermined time period, and a signal turning said transmission gate on and off.

10. The data hold circuit as claimed in claim 3, wherein said operation state detection circuit produces said operation state detection signal designating said power-saving mode when an idle state, in which said logic circuit does not process data, continues for a predetermined time period.

11. The data hold circuit as claimed in claim 3, wherein said operation state detection circuit produces said operation state detection signal which designates said normal mode when said operation state detection circuit detects, in a time division multiplex signal inputted to said logic circuit, data addressed to said logic circuit, and which designates said power-saving mode in the other conditions.

12. The data hold circuit as claimed in claim 3, further comprising an operation state detection circuit which detects an operation state of said logic circuit and produces an operation state detection signal, wherein said control circuit generates a signal defining said first predetermined time period and said second predetermined time period on the basis of said operation state detection signal.

13. The data hold circuit as claimed in claim 3, wherein said memory circuit comprises a first inverter whose input terminal is connected to said switch element, and a second inverter whose input terminal is connected to an output terminal of said first inverter, and whose output terminal is connected to the input terminal of said first inverter.

14. The data hold circuit as claimed in claim 3, wherein switch circuit comprises a plurality of switch elements, each of said switch elements being connected between a particular node of said logic circuit and one of said switch elements in said memory circuit, and said control circuit controls all of said switch elements at the same time.

15. The data hold circuit as claimed in claim 1, wherein said logic circuit includes a dynamic latch circuit, said switch element is connected to a data holding node of said dynamic latch circuit, and said control circuit keeps said switch element ON during said power-saving mode so that said memory circuit is combined with said dynamic latch circuit to constitute a static latch circuit during said power-saving mode.

16. The data hold circuit as claimed in claim 15, wherein said control circuit includes an operation speed detection circuit which decides that it is the normal mode when a clock frequency supplied to said dynamic latch circuit is higher than a predetermined value, and that it is the power-saving mode when the clock frequency is lower than the predetermined value.

17. The data hold circuit as claimed in claim 15, wherein said dynamic latch circuit comprises a first inverter, a first transmission gate, and a second inverter connected in cascade, and said switch element is connected to the connecting point of said first transmission gate and said second inverter.

18. The data hold circuit as claimed in claim 17, wherein said memory circuit comprises a third inverter whose input terminal is connected to said switch element, a fourth inverter whose input terminal is connected to an output terminal of said third inverter, and a second transmission gate connected between an output terminal of said fourth inverter and an input terminal of said third inverter, and wherein said first transmission gate and said second transmission gate are alternately turned on and off.

19. The data hold circuit as claimed in claim 16, wherein said operation speed detection circuit comprises a delay inverter whose input terminal is supplied with a clock signal, a coincidence circuit whose first input terminal is supplied with the clock signal and whose second input terminal is supplied with the output of said delay inverter, an inverter inverting the output of said coincidence circuit, and a capacitor connected to the output of said inverter.

20. The data hold circuit as claimed in claim 1, wherein input terminals of said logic circuit are connected to output terminals of another circuit, said control circuit, immediately before supply of power to said logic circuit is interrupted, locks a state of output data of the output terminals of said another circuit, and subsequently, turns on said switch circuit for said first predetermined time period, and said control circuit, immediately after the supply of the power to the logic circuit is restarted, turns said switch circuit on for said second predetermined time period, and subsequently, releases the locked state of said output data of the output terminals of said another circuit.

* * * * *